(12) United States Patent
Jeong et al.

(10) Patent No.: US 10,861,864 B2
(45) Date of Patent: *Dec. 8, 2020

(54) THREE-DIMENSIONAL SEMICONDUCTOR DEVICES

(71) Applicant: SAMSUNG ELECTRONICS CO., LTD., Suwon-si (KR)

(72) Inventors: Da Woon Jeong, Hwaseong-si (KR); Jihye Kim, Anyang-si (KR); Joowon Park, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/682,133

(22) Filed: Nov. 13, 2019

(65) Prior Publication Data

US 2020/0083242 A1 Mar. 12, 2020

Related U.S. Application Data

(63) Continuation of application No. 16/136,438, filed on Sep. 20, 2018, now Pat. No. 10,483,274, which is a (Continued)

(30) Foreign Application Priority Data

Apr. 1, 2015 (KR) .................. 10-2015-0046040

(51) Int. Cl.
*H01L 27/11565* (2017.01)
*H01L 27/11582* (2017.01)
(Continued)

(52) U.S. Cl.
CPC .... *H01L 27/11565* (2013.01); *H01L 27/1157* (2013.01); *H01L 27/11575* (2013.01); *H01L 27/11582* (2013.01)

(58) Field of Classification Search
CPC .......... H01L 27/1157; H01L 27/11575; H01L 27/115782; H01L 27/11565
(Continued)

(56) References Cited

U.S. PATENT DOCUMENTS 8,541,831 B2 9/2013 Chae et al.
9,748,258 B2 * 8/2017 Jeong ............... H01L 27/11565
(Continued)

FOREIGN PATENT DOCUMENTS

CN 102263065 A 11/2011
CN 103594475 A 2/2014
(Continued)

*Primary Examiner* — Tong-Ho Kim
(74) *Attorney, Agent, or Firm* — Lee IP Law, P.C.

(57) ABSTRACT

A three-dimensional semiconductor device includes an electrode structure on a substrate that includes a first region and a second region, the electrode structure including a ground selection electrode, cell electrodes, and a string selection electrode which are sequentially stacked on the substrate wherein the ground selection electrode, the cell electrodes, and the string selection electrode respectively include a ground selection pad, cell pads, and a string selection pad which define a stepped structure in the second region of the substrate, a plurality of dummy pillars penetrating each of the cell pads and a portion of the electrode structure under each of the cell pads, and a cell contact plug electrically connected to each of the cell pads, wherein each of the dummy pillars penetrates a boundary between adjacent cell pads, and wherein the adjacent cell pads share the dummy pillars.

20 Claims, 19 Drawing Sheets

Related U.S. Application Data continuation of application No. 15/684,098, filed on Aug. 23, 2017, now Pat. No. 10,083,977, which is a continuation of application No. 15/054,428, filed on Feb. 26, 2016, now Pat. No. 9,748,258.

(51) Int. Cl.
*H01L 27/11575* (2017.01)
*H01L 27/1157* (2017.01)

(58) Field of Classification Search
USPC .......................................................... 257/324
See application file for complete search history.

(56) References Cited

U.S. PATENT DOCUMENTS

| | | |
|---|---|---|
| 10,083,977 B2 * | 9/2018 | Jeong ................ H01L 27/11582 |
| 2011/0287612 A1 | 11/2011 | Lee et al. |
| 2012/0061743 A1 | 3/2012 | Watanabe et al. |
| 2015/0235939 A1 | 8/2015 | Lee et al. |
| 2015/0287710 A1 | 10/2015 | Yun et al. |
| 2016/0276358 A1 | 9/2016 | Li |
| 2017/0236836 A1 | 8/2017 | Huo et al. |

FOREIGN PATENT DOCUMENTS

| | | |
|---|---|---|
| CN | 104157654 A | 11/2014 |
| CN | 104979313 A | 10/2015 |
| KR | 10-2011-0015337 A | 2/2011 |
| KR | 10-2012-0111375 A | 10/2012 |
| KR | 10-2015-0096583 A | 8/2015 |

* cited by examiner

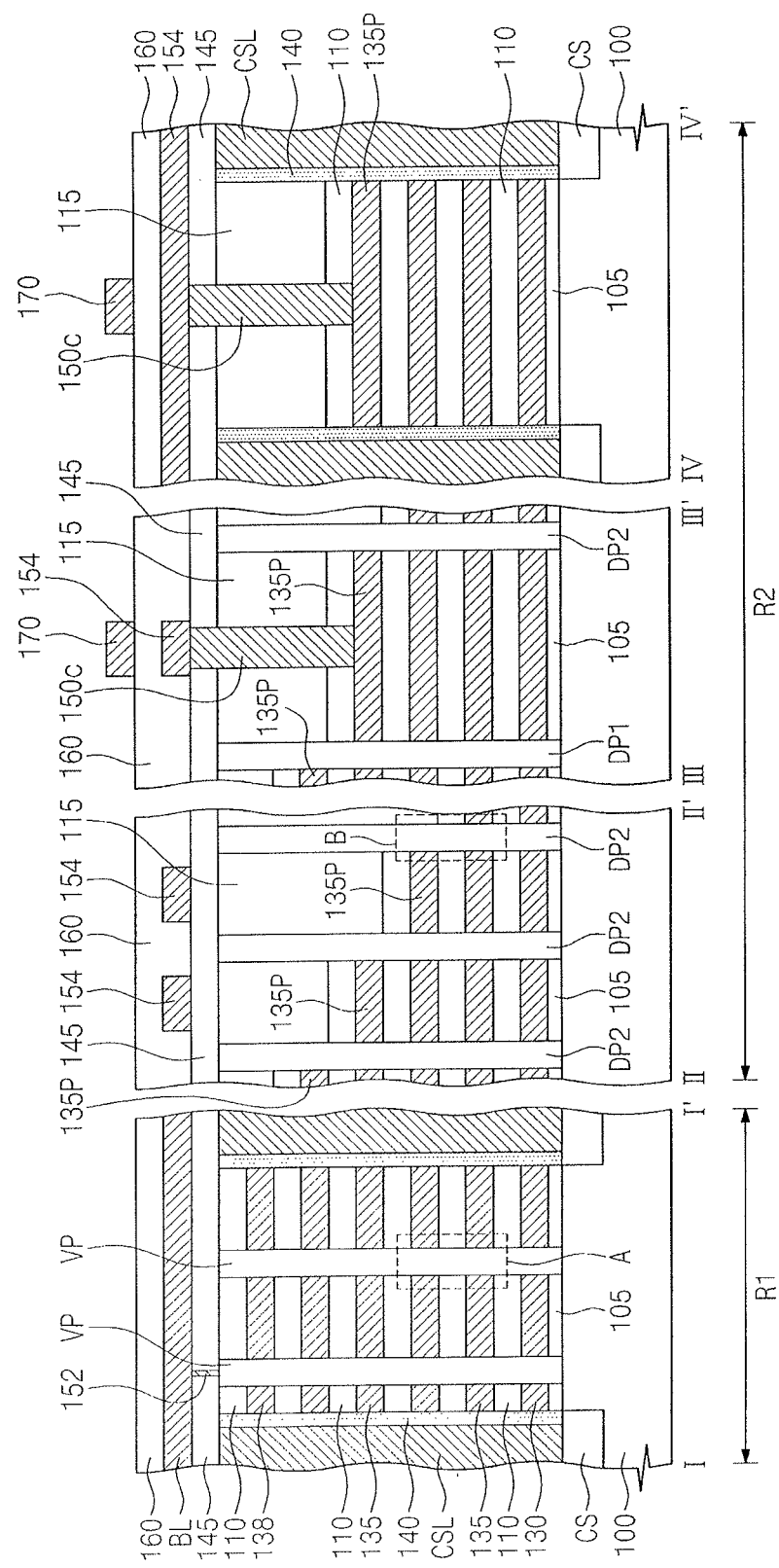

THREE-DIMENSIONAL SEMICONDUCTOR DEVICES

CROSS-REFERENCE TO RELATED APPLICATIONS

This is a continuation application based on pending application Ser. No. 16/136,438, filed Sep. 20, 2018, which in turn is a continuation of application Ser. No. 15/684,098, filed Aug. 23, 2017, now U.S. Pat. No. 10,083,977 B2, issued Sep. 25, 2018, which in turn is a continuation of application Ser. No. 15/054,428, filed Feb. 26, 2016, now U.S. Pat. No. 9,748,258 B2 issued Aug. 29, 2017, the entire contents of all being hereby incorporated by reference.

Korean Patent Application No. 10-2015-0046040, filed on Apr. 1, 2015, in the Korean Intellectual Property Office, and entitled: "Three-Dimensional Semiconductor Devices," is incorporated by reference herein in its entirety.

BACKGROUND

1. Field

Embodiments relate to a semiconductor device and, more particularly, to three-dimensional (3D) semiconductor devices.

2. Description of the Related Art

Semiconductor devices have been highly integrated to provide high performance and low costs demanded by users. The integration density of semiconductor devices may directly affect the costs of the semiconductor devices, so highly integrated semiconductor devices are demanded. The integration density of a conventional two-dimensional (2D) or planar memory device may be mainly determined by an area where a unit memory cell occupies, and thus, the integration density of the conventional 2D memory device may be greatly affected by a technique of forming fine patterns. However, since extremely high-priced apparatuses are needed to form fine patterns, the integration density of 2D memory devices continues to increase but is still limited.

Semiconductor devices (e.g., three-dimensional (3D) memory devices) including three-dimensionally arranged memory cells have been developed to overcome the above limitations. However, reliability of the 3D memory devices may be deteriorated by structural characteristics thereof.

SUMMARY

Embodiments may provide three-dimensional (3D) semiconductor devices with excellent reliability.

Embodiments may also provide 3D semiconductor devices capable of minimizing or preventing deterioration of an electrode structure.

In one aspect, a three-dimensional (3D) semiconductor device may include an electrode structure provided on a substrate including a first region and a second region. The electrode structure may include a ground selection electrode, cell electrodes and a string selection electrode which are sequentially stacked on the substrate. The ground selection electrode, the cell electrodes and the string selection electrode may respectively include a ground selection pad, cell pads and a string selection pad which constitute a stepped structure in the second region. The 3D semiconductor device may also include a plurality of dummy pillars penetrating each of the cell pads and the electrode structure disposed under each of the cell pads, and a cell contact plug electrically connected to each of the cell pads. Each of the dummy pillars may penetrate a boundary between each of the cell pads and a pad adjacent to each of the cell pads. Each of the cell pads and pads adjacent to both sides of each of the cell pads may share the dummy pillars.

In an embodiment, the electrode structure may extend in a first direction parallel to a top surface of the substrate. The dummy pillars may include a pair of first dummy pillars arranged in the first direction, and a pair of second dummy pillars arranged in the first direction and spaced apart from the pair of first dummy pillars in a second direction intersecting the first direction.

In an embodiment, one of the pair of first dummy pillars may penetrate a first boundary between each of the cell pads and an upper pad adjacent to each of the cell pads, and the other of the pair of first dummy pillars may penetrate a second boundary between each of the cell pads and a lower pad adjacent to each of the cell pads. One of the pair of second dummy pillars may penetrate the first boundary, and the other of the pair of second dummy pillars may penetrate the second boundary.

In an embodiment, the dummy pillars may be disposed to surround the cell contact plug when viewed from a plan view.

In an embodiment, one of the first dummy pillars may be aligned with one of the second dummy pillars in a third direction intersecting the first and second directions. The one of the first dummy pillars, the cell contact plug, and the one of the second dummy pillars may be aligned with each other in the third direction.

In an embodiment, the dummy pillars may be disposed at vertexes of an imaginary polygon, respectively, when viewed from a plan view. The cell contact plug may be disposed at a central point of the imaginary polygon when viewed from a plan view.

In an embodiment, the imaginary polygon may be a quadrangle.

In an embodiment, the cell contact plug may be disposed between the first dummy pillars so as to be aligned with the first dummy pillars in the first direction.

In an embodiment, the cell contact plug may be aligned with another cell contact plug, which is electrically connected to another cell pad immediately adjacent to each of the cell pads, in the first direction.

In an embodiment, the cell contact plugs connected to the cell pads may be arranged in a zigzag form along the first direction.

In an embodiment, the number of the dummy pillars penetrating each of the cell pads may be four. Each of the cell pads and the pads adjacent to both sides of each of the cell pads may share the four dummy pillars.

In an embodiment, the 3D semiconductor device may further include a plurality of vertical patterns penetrating the electrode structure in the first region. The dummy pillars may include the same material as the vertical patterns.

In an embodiment, top surfaces of the dummy pillars may be disposed at the substantially same level as top surfaces of the vertical patterns, and bottom surfaces of the dummy pillars may be disposed at the substantially same level as bottom surfaces of the vertical patterns.

In an embodiment, each of the vertical patterns may include a vertical semiconductor pattern extending in a direction perpendicular to a top surface of the substrate, and a tunnel insulating layer, a charge storage layer and a blocking insulating layer which are disposed between the vertical semiconductor pattern and each of the cell electrodes.

In another aspect, a three-dimensional (3D) semiconductor device may include an electrode structure provided on a substrate including a first region and a second region. The electrode structure may include a ground selection electrode, cell electrodes and a string selection electrode which are sequentially stacked on the substrate. The ground selection electrode, the cell electrodes and the string selection electrode may respectively include a ground selection pad, cell pads and a string selection pad which constitute a stepped structure in the second region. The 3D semiconductor device may also include a plurality of vertical patterns penetrating the electrode structure in the first region, a plurality of dummy pillars penetrating each of the cell pads and the electrode structure disposed under each of the cell pads, and a cell contact plug electrically connected to each of the cell pads. The vertical patterns may include a first vertical pattern and second vertical patterns surrounding the first vertical pattern. The first vertical pattern may be disposed at a central point of a first imaginary polygon in a plan view, and the second vertical patterns may be respectively disposed at vertexes of the first imaginary polygon in a plan view. The dummy pillars may be respectively disposed at vertexes of a second imaginary polygon in a plan view. The number of the vertexes of the first imaginary polygon may be different from the number of the vertexes of the second imaginary polygon.

In an embodiment, the cell contact plug may be disposed at a central point of the second imaginary polygon.

In an embodiment, the first imaginary polygon may be a hexagon, and the second imaginary polygon may be a quadrangle.

In an embodiment, each of the dummy pillars may penetrate a boundary between each of the cell pads and a pad adjacent to each of the cell pads.

In an embodiment, the number of the dummy pillars penetrating each of the cell pads may be four. Each of the cell pads and the pads adjacent to both sides of each of the cell pads may share the four dummy pillars.

In an embodiment, the dummy pillars may include the same material as the vertical patterns. Top surfaces of the dummy pillars may be disposed at the substantially same level as top surfaces of the vertical patterns, and bottom surfaces of the dummy pillars may be disposed at the substantially same level as bottom surfaces of the vertical patterns.

In another aspect, a three-dimensional (3D) semiconductor device includes an electrode structure on a substrate that includes a first region and a second region, the electrode structure including a plurality of cell electrodes, a plurality of cell pads in the second region of the substrate, the cell pads with corresponding cell electrodes defining a stepped structure, a plurality of dummy pillars through the cell pads and the electrode structure under, the dummy pillars being only at a boundary between adjacent cell pads, and a cell contact plug electrically connected to each of the cell pads.

In an embodiment, the dummy pillars may be at vertexes of an imaginary polygon surrounding the cell contact plug.

In an embodiment, the cell contact plug may be in a center of the imaginary polygon, the polygon being a quadrangle.

In an embodiment, the semiconductor device may further includes a common source region outside the electrode structure, the dummy pillars and the cell contact plug penetrating a central portion of the electrode structure.

In an embodiment, the first region of the substrate may be a memory region including a plurality of vertical patterns through the electrode structure, the dummy pillars having a same height and including a same material as the vertical patterns.

BRIEF DESCRIPTION OF THE DRAWINGS

Features will become apparent to those of ordinary skill in the art by describing in detail exemplary embodiments with reference to the attached drawings, in which:

FIG. 3 illustrates a cross-sectional view taken along lines I-I', II-II', III-III', and IV-IV' of FIG. 1.

DETAILED DESCRIPTION

Figure 1:
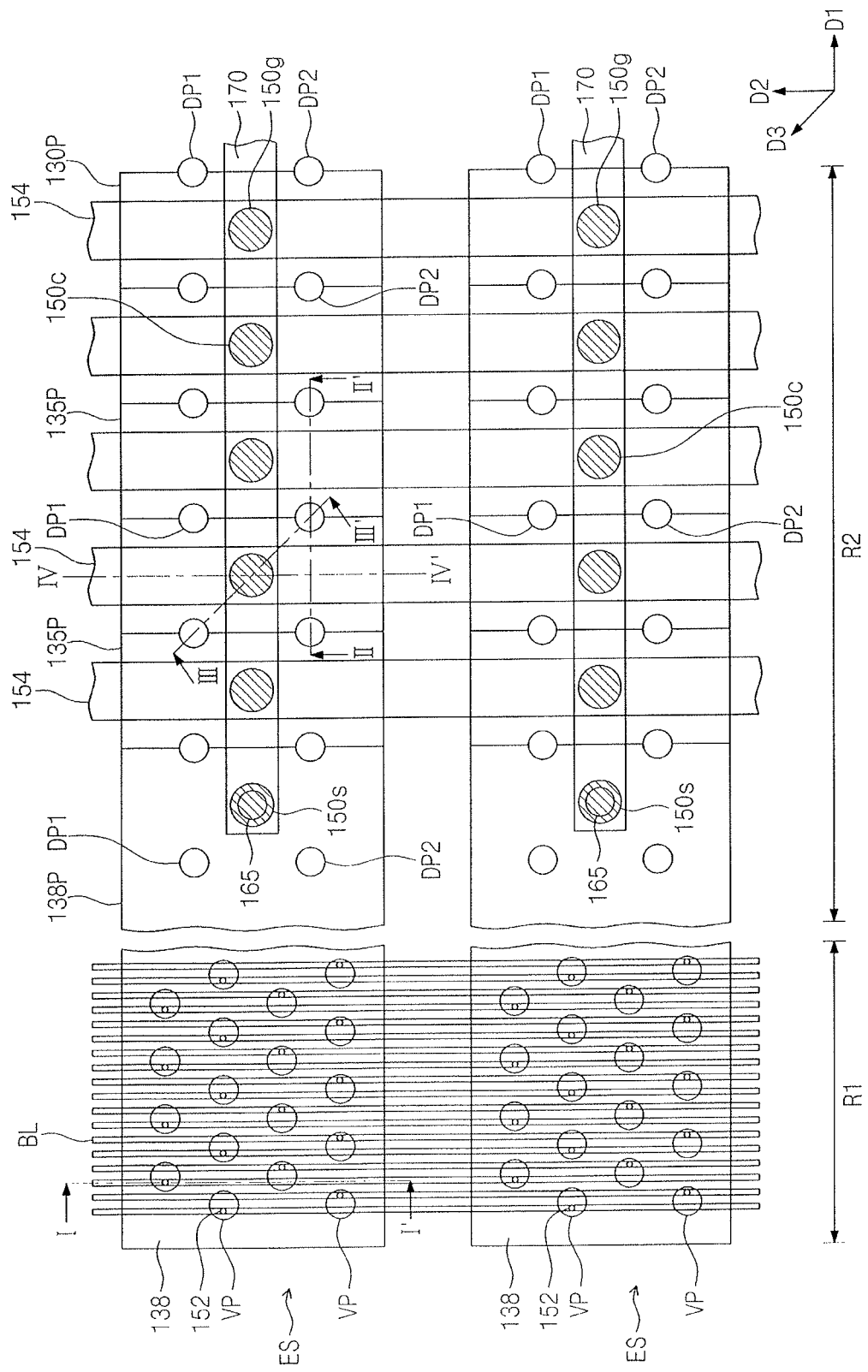
FIG. 1 illustrates a plan view of a three-dimensional (3D) semiconductor device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

As used herein, the term "and/or" includes any and all combinations of one or more of the associated listed items. Additionally, in the drawing figures, the dimensions of layers and regions may be exaggerated for clarity of illustration. It will be understood that when an element, e.g., a layer, region or substrate, is referred to as being "on" another element, it can be directly on the other element or intervening elements may be present. In contrast, the term "directly"

means that there are no intervening elements, e.g., same interpretation may be applied to the term "between." The same reference numerals or the same reference designators denote the same elements throughout the specification.

Moreover, exemplary embodiments are described herein with reference to cross-sectional views and/or plane views that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to limit. It will be also understood that although the terms first, second, third etc. may be used herein to describe various elements, these elements should not be limited by these terms. These terms are only used to distinguish one element from another element. Thus, a first element in some embodiments could be termed a second element in other embodiments. Exemplary embodiments explained and illustrated herein include their complementary counterparts.

The terminology used herein is for the purpose of describing particular embodiments only and is not intended to limit. As used herein, the singular terms "a," "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Hereinafter, embodiments will be described with reference to the accompanying drawings.

Figure 2:
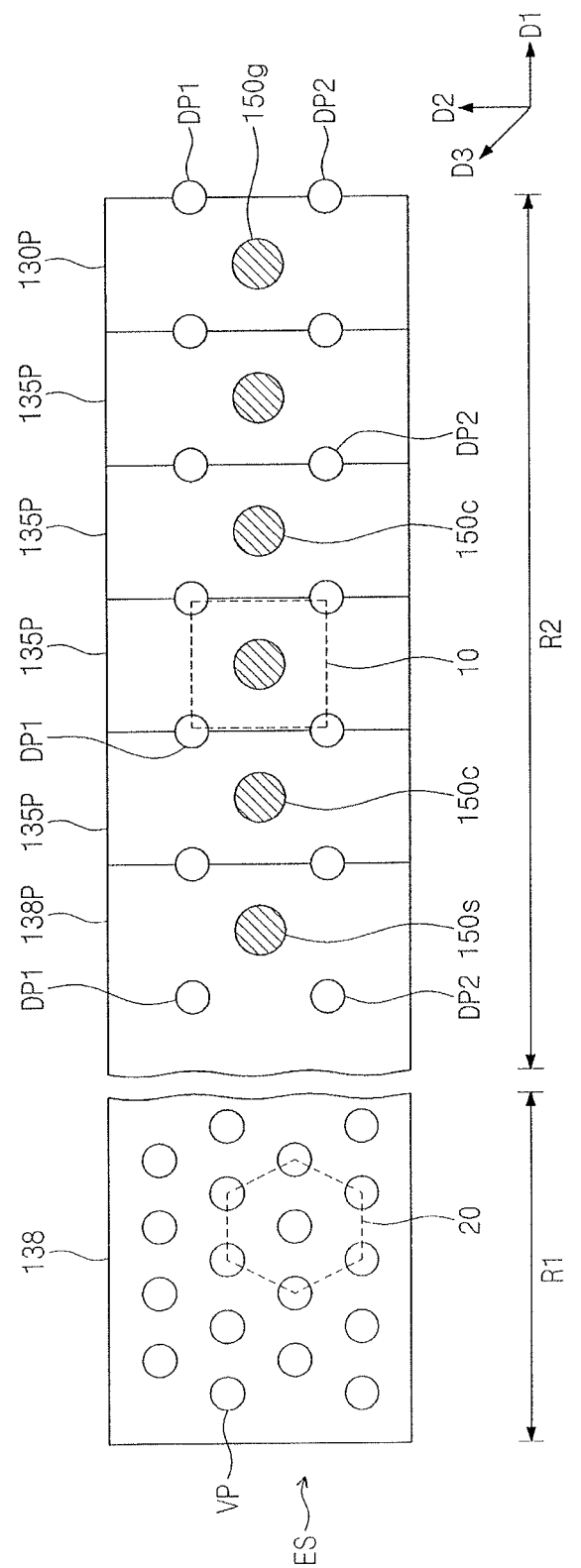
FIG. 2 illustrates a plan view of one electrode structure of FIG. 1 to explain dummy pillars according to an embodiment.

FIG. 1 is a plan view illustrating a three-dimensional (3D) semiconductor device according to an embodiment. FIG. 2 is a plan view illustrating one electrode structure of FIG. 1 to explain dummy pillars according to an embodiment. In FIG. 2, interconnections of FIG. 1 are omitted to clearly illustrate arrangement of the dummy pillars. FIG. 3 is a cross-sectional view taken along lines I-I', II-II', III-III', and IV-IV' of FIG. 1.

Referring to FIGS. 1, 2, and 3, a substrate 100 may include a first region R1 and a second region R2. The substrate 100 may be a semiconductor substrate (e.g., a silicon substrate, a germanium substrate, or a silicon-germanium substrate). The first region R1 may be a cell region, in which memory cells are three-dimensionally arranged, and the second region R2 may be a connection region, in which pads are provided. Contact plugs used to apply voltages to the memory cells may be disposed on top surfaces of the pads.

Electrode structures ES may be disposed on the substrate 100. The electrode structures ES may extend from the first region R1 into the second region R2. The electrode structures ES may extend in a first direction D1 and may be spaced apart from each other in a second direction D2 intersecting the first direction D1.

Each of the electrode structures ES may include electrodes 130, 135, and 138 sequentially stacked on the substrate 100 of the first region R1, and insulating layers 110 disposed between the electrodes 130, 135, and 138. The electrodes 130, 135, and 138 and the insulating layers 110 may be alternately stacked on the substrate 100. The electrodes 130, 135, and 138 may be electrically insulated from each other by the insulating layers 110. The electrodes 130, 135, and 138 may respectively include pads 130P, 135P, and 138P that constitute a stepped structure in the second region R2. The pads 130P, 135P, and 138P may extend from the electrodes 130, 135 and 138 of the first region R1 in the first direction D1, respectively, to constitute the stepped structure in the second region R2 (referring to II-II', III-II' of FIG. 3). The insulating layers 110 may also extend from the first region R1 into the second region R2 to cover the pads 130P, 135P and 138P, respectively.

The electrodes 130, 135, and 138 of each of the electrode structures ES may include a ground selection electrode 130, a string selection electrode 138, and cell electrodes 135 disposed between the ground selection electrode 130 and the string selection electrode 138. The cell electrodes 135 may be stacked in a direction perpendicular to a top surface of the substrate 100 between the ground selection electrode 130 and the string selection electrode 138. The pads 130P, 135P, and 138P may include a ground selection pad 130P extending from the ground selection electrode 130, a string selection pad 138P extending from the string selection electrode 138, and cell pads 135P extending from the cell electrodes 135, respectively.

Each of the electrode structures ES may further include a capping insulating layer 115 that covers at least the cell pads 135P and the ground selection pad 130P in the second region R2. The capping insulating layer 115 may include an insulating material (e.g., silicon oxide). In addition, each of the electrode structures ES may further include a buffer insulating layer 105 which is provided under the ground selection electrode 130 and the ground selection pad 130P. The buffer insulating layer 105 may include an insulating material (e.g., silicon oxide).

A plurality of vertical patterns VP may be provided on the substrate 100 of the first region R1 and may penetrate each of the electrode structures ES. The vertical patterns VP may penetrate each of the electrode structures ES so as to be in contact with the substrate 100. Each of the vertical patterns VP may include a semiconductor layer. The vertical patterns VP will be described later in more detail with reference to FIGS. 4A to 4D.

As illustrated in FIGS. 1 and 2, the vertical patterns VP may be two-dimensionally arranged on the substrate 100 when viewed from a plan view. In an embodiment, the vertical patterns VP may constitute a plurality of rows parallel to the first direction D1. The vertical patterns VP constituting adjacent two of the plurality of rows may be arranged in a zigzag form along the first direction D1, e.g., each row of the vertical patterns VP may be offset along the first direction D1 with respect to an adjacent row to have the vertical patterns VP arranged in a zigzag pattern along the second direction D2.

A plurality of dummy pillars DP1 and DP2 may be provided on the substrate 100 of the second region R2 and may penetrate each of the electrode structures ES. The dummy pillars DP1 and DP2 may penetrate each of the electrode structures ES so as to be in contact with the substrate 100. As illustrated in FIG. 3, top surfaces of the dummy pillars DP1 and DP2 may be disposed at a substantially same level (or height) as top surfaces of the vertical patterns VP, and bottom surfaces of the dummy pillars DP1 and DP2 may be disposed at a substantially same level (or height) as bottom surfaces of the vertical patterns VP. Each of the dummy pillars DP1 and DP2 may include the same material as the vertical patterns VP. The dummy pillars DP1 and DP2 will be described later in more detail with reference to FIGS. 4A to 4D.

The dummy pillars DP1 and DP2 may penetrate each of the pads 130P, 135P, and 138P and the electrode structure ES under each of the pads 130P, 135P and 138P. In addition, the dummy pillars DP1 and DP2 may also penetrate the capping layer 115 covering at least the cell pads 135P and the ground selection pad 130P. The dummy pillars DP1 and DP2 may include first dummy pillars DP1 arranged in the first direction D1, and second dummy pillars DP2 arranged in the first direction D1 and spaced apart from the first dummy pillars DP1 in the second direction D2. In an embodiment, the second dummy pillars DP2 may be aligned with the first dummy pillars DP1 in the second direction D2, respectively.

The dummy pillars DP1 and DP2 penetrating each of the cell pads 135P may include a pair of the first dummy pillars DP1 immediately adjacent to each other along the first direction D1, and a pair of the second dummy pillars DP2 immediately adjacent to each other along the first direction D1. A first one of the pair of first dummy pillars DP1 may penetrate a first boundary between each of the cell pads 135P and an adjacent pad (an upper pad 135P or 138P) along the first direction D1, e.g., a boundary on a left side of each of the cell pads 135P in FIG. 1, and a second one of the pair of first dummy pillars DP1 may penetrate a second boundary between each of the cell pads 135P and an adjacent pad (a lower pad 135P or 130P) along the first direction D1, e.g., a boundary on a right side of each of the cell pads 135P in FIG. 1. A first of the pair of second dummy pillars DP2 may penetrate the first boundary, e.g., left boundary, and a second of the pair of second dummy pillars DP2 may penetrate the second boundary, e.g., right boundary. The first of the pair of second dummy pillars DP2 may be aligned with the first of the pair of first dummy pillars DP1 on the first boundary along the second direction D2, and the second of the pair of second dummy pillars DP2 may be aligned with the second of the pair of first dummy pillars DP1 on the second boundary along the second direction D2. In an embodiment, the number of the dummy pillars DP1 and DP2 penetrating each of the cell pads 135P may be four, and each of the cell pads 135P and the pads disposed at both sides thereof may share the four dummy pillars DP1 and DP2.

In an embodiment, the dummy pillars DP1 and DP2 penetrating the string selection pad 138P may also include a pair of the first dummy pillars DP1 immediately adjacent to each other, e.g., along the first direction D1, and a pair of the second dummy pillars DP2 immediately adjacent to each other, e.g., along the first direction D1. A first one of the pair of first dummy pillars DP1 penetrating the string selection pad 138P may penetrate a boundary between the string selection pad 138P and the cell pad 135P adjacent thereto along the first direction D1, and a second one of the pair of first dummy pillars DP1 may be spaced apart from the boundary. A first one of the pair of second dummy pillars DP2 penetrating the string selection pad 138P may penetrate the boundary, and a second one of the pair of second dummy pillars DP2 may be spaced apart from the boundary. The string selection pad 138P may be disposed at the uppermost layer of the electrode structure ES, so the string selection pad 138P may have one boundary. The first one of the pair of second dummy pillars DP2 penetrating the string selection pad 138P may be aligned, e.g., along the second direction D2, with the first one of the pair of first dummy pillars DP1 penetrating the string selection pad 138P on the boundary, and the second of the pair of second dummy pillars DP2 may be aligned with the second of the pair of first dummy pillars DP1 in the second direction D2. In an embodiment, the number of the dummy pillars DP1 and DP2 penetrating the string selection pad 138P may be four, and the string selection pad 138P and the cell pad 135P adjacent thereto may share two of the four dummy pillars DP1 and DP2 along their boundary.

The dummy pillars DP1 and DP2 penetrating the ground selection pad 130P may also include a pair of the first dummy pillars DP1 immediately adjacent to each other and a pair of the second dummy pillars DP2 immediately adjacent to each other. A first one of the pair of first dummy pillars DP1 penetrating the ground selection pad 130P may penetrate a boundary between the ground selection pad 130P and the cell pad 135P adjacent thereto, and a second one of the pair of first dummy pillars DP1 may be spaced apart from the boundary. A first one of the pair of second dummy pillars DP2 penetrating the ground selection pad 130P may penetrate the boundary, and a second one of the pair of second dummy pillars DP2 may be spaced apart from the boundary. The first of the pair of second dummy pillars DP2 penetrating the ground selection pad 130P may be aligned with the first of the pair of first dummy pillars DP1 penetrating the ground selection pad 130P on the boundary, and the second of the pair of second dummy pillars DP2 may be aligned with the second of the pair of first dummy pillars DP1 in the second direction D2. In an embodiment, the number of the dummy pillars DP1 and DP2 penetrating the ground selection pad 130P may be four, and the ground selection pad 130P and the cell pad 135P adjacent thereto may share two of the four dummy pillars DP1 and DP2.

Common source regions CS may be provided in the substrate 100 at both sides of each of the electrode structures ES, e.g., cross section along line IV-IV' in FIG. 3. The substrate 100 may be doped with dopants of a first conductivity type, and the common source regions CS may be doped with dopants of a second conductivity type different from the first conductivity type. Common source lines CSL may be provided at both sides of each of the electrode structures ES so as to be connected to the common source regions CS. The common source lines CSL may include a conductive material (e.g., a metal material such as tungsten). Insulating spacers 140 may be provided between each of the electrode structures ES and the common source lines CSL, respectively. The insulating spacers 140 may include, for example, silicon oxide. A first insulating layer 145 may be provided on top surfaces of the electrode structures ES. The first insulating layer 145 may cover the top surfaces of the electrode structures ES and may extend onto top surfaces of the insulating spacers 140 and top surfaces of the common source lines CSL. The first insulating layer 145 may include at least one of, e.g., a silicon oxide layer, a silicon nitride layer, or a silicon oxynitride layer.

Cell contact plugs 150c may be provided on the substrate 100 of the second region R2 so as to be connected to the cell pads 135P of each of the electrode structures ES, respectively. The cell contact plugs 150c may penetrate the first insulating layer 145, the capping insulating layer 115, and the insulating layers 110 in the second region R2. A string selection contact plug 150s may be provided on the substrate 100 in the second region R2 so as to be connected to the string selection pad 138P of each of the electrode structures ES. A ground selection contact plug 150g may be provided on the substrate 100 of the second region R2 so as to be connected to the ground selection pad 130P of each of the electrode structures ES. The string selection contact plug 150s may penetrate the first insulating layer 145 and the insulating layer 110 disposed on the string selection pad 138P, and the ground selection contact plug 150g may penetrate the first insulating layer 145, the capping insulating layer 115, and the insulating layer 110 disposed on the ground selection pad 130P. According to an embodiment, the string selection contact plug 150s, the cell contact plugs 150c, and the ground selection contact plug 150g may be arranged, e.g., aligned, along the first direction D1.

According to an embodiment, the dummy pillars DP1 and DP2 penetrating each of the cell pads 135P may be arranged to surround the cell contact plug 150c connected to each of the cell pads 135P when viewed from a plan view, as illustrated in FIG. 2. That is, the dummy pillars DP1 and DP2 penetrating each of the cell pads 135P may be respectively disposed at vertexes of a first imaginary polygon 10 when viewed from a plan view. Central points of the dummy pillars DP1 and DP2 penetrating each of the cell pads 135P may overlap with the vertexes of the first imaginary polygon 10, respectively. The first imaginary polygon 10 may be a quadrangle. In other words, four dummy pillars DP1 and DP2 may surround the cell contact plug 150c, e.g., the four dummy pillars DP1 and DP2 may define four vertexes of a polygon surrounding the cell contact plug 150c. The cell contact plug 150c may be disposed at a central point of the first imaginary polygon 10 when viewed from a plan view. In this case, a first of the pair of first dummy pillars DP1 penetrating each of the cell pads 135P may be aligned with a second of the pair of second dummy pillars DP2 penetrating each of the cell pads 135P in a third direction D3 intersecting the first and second directions D1 and D2. In this case, the first of the pair of first dummy pillars DP1, the cell contact plug 150c, and the second of the pair of second dummy pillars DP2 may be aligned with each other in the third direction D3.

The dummy pillars DP1 and DP2 penetrating the string selection pad 138P may be arranged to surround the string selection contact plug 150s connected to the string selection pad 138P when viewed from a plan view. The dummy pillars DP1 and DP2 penetrating the string selection pad 138P may be respectively disposed at the vertexes of the first imaginary polygon 10 defined on the string selection pad 138P when viewed from a plan view, and the string selection contact plug 150s may be disposed at the central point of the first imaginary polygon 10. Likewise, the dummy pillars DP1 and DP2 penetrating the ground selection pad 130P may be arranged to surround the ground selection contact plug 150g connected to the ground selection pad 130P when viewed from a plan view. The dummy pillars DP1 and DP2 penetrating the ground selection pad 130P may be respectively disposed at the vertexes of the first imaginary polygon 10 defined on the ground selection pad 130P when viewed from a plan view, and the ground selection contact plug 150g may be disposed at the central point of the first imaginary polygon 10.

The vertical patterns VP may include outer vertical patterns VP constituting the outermost rows of the plurality of rows, and inner vertical patterns VP constituting inner rows of the plurality of rows. As illustrated in FIG. 2, neighboring vertical patterns VP surrounding each of the inner vertical patterns VP may be respectively disposed at vertexes of a second imaginary polygon 20 in a plan view, and each of the inner vertical patterns VP may be disposed at a central point of the second imaginary polygon 20 in a plan view. The number of the vertexes of the second imaginary polygon 20 may be different from the number of the vertexes of the first imaginary polygon 10. In an embodiment, the second imaginary polygon 20 may be a hexagon.

Bit lines BL may be disposed on the first insulating layer 145 of the first region R1. The bit lines BL may extend in the second direction D2 and may be spaced apart from each other in the first direction D1. The vertical patterns VP penetrating each of the electrode structures ES may be electrically connected to the bit lines BL, respectively. Each of the vertical patterns VP may be electrically connected to a corresponding one of the bit lines BL through a bit line contact plug 152 penetrating the first insulating layer 145. The cell electrodes 135 may correspond to word lines, the ground selection electrode 130 may correspond to a ground selection line, and the string selection electrode 138 may correspond to a string selection line.

First interconnections 154 may be provided on the first insulating layer 145 of the second region R2. The first interconnections 154 may extend in the second direction D2 and may be spaced apart from each other in the first direction D1. The first interconnections 154 may be electrically connected to the cell contact plugs 150c and the ground selection contact plug 150g of the electrode structure ES, respectively. In an embodiment, the first interconnections 154 may be disposed at a substantially same level (or height) as the bit lines BL. However, embodiments are not limited thereto.

A second insulating layer 160 may be provided on the first insulating layer 145, the bit lines BL, and the first interconnections 154. The second insulating layer 160 may include at least one of, e.g., a silicon oxide layer, a silicon nitride layer, or a silicon oxynitride layer.

Second interconnections 170 may be provided on the second insulating layer 160. In an embodiment, the second interconnections 170 may extend in the first direction D1 and may be spaced apart from each other in the second direction D2. However, embodiments are not limited thereto. Each of the second interconnections 170 may be electrically connected to the string selection contact plug 150s of each of the electrode structures ES. The string selection contact plug 150s may be electrically connected to a corresponding one of the second interconnections 170 through an interconnection plug 165 penetrating the second insulating layer 160.

According to the present embodiment, the dummy pillars DP1 and DP2 may penetrate the pads 130P, 135P, and 138P constituting the stepped structure in the second region R2 so as to be in contact with the substrate 100. The dummy pillars DP1 and DP2 penetrating each of the cell pads 135P may penetrate, e.g., only, the first and second boundaries between each of the cell pads 135P and the pads adjacent to both sides of each of the cell pads 135P. In other words, each of the cell pads 135P and the pads adjacent to both sides thereof share the dummy pillars DP1 and DP2 penetrating each of the cell pads 135P, thereby minimizing a number of dummy pillars in the second region R2. Since the electrode structure ES is supported using a minimum of the dummy pillars DP1 and DP2, shape variation of the electrode structure ES may be minimized. In addition, the minimum of the dummy pillars DP1 and DP2 may support a mold stack structure used during a replacement process of forming the electrode structure ES, and thus, shape variation of the pads 130P, 135P, and 138P may be minimized using the minimum of the dummy pillars DP1 and DP2. As a result, it is possible to minimize or prevent deterioration of the electrode structure ES.

Furthermore, the dummy pillars DP1 and DP2 penetrating each of the cell pads 135P may be disposed to surround the cell contact plug 150c connected to each of the cell pads 135P when viewed from a plan view. Thus, a distance between the cell contact plug 150c and the common source line CSL adjacent thereto may be increased to easily insulate the cell contact plug 150c from the common source line CSL.

As a result, a 3D semiconductor device with excellent reliability may be provided.

Figure 4A:
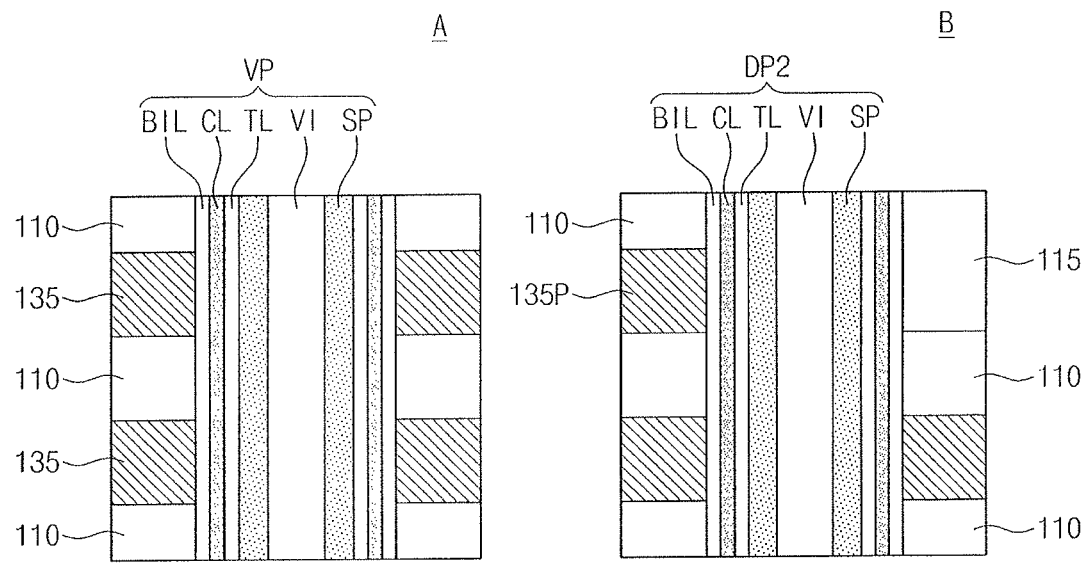
FIG. 4A illustrates enlarged views of portions 'A' and 'B' of FIG. 3 to explain a vertical pattern and a dummy pillar according to an embodiment.

FIG. 4A illustrates enlarged views of portions 'A' and 'B' of FIG. 3 to explain a vertical pattern and a dummy pillar according to an embodiment.

Referring to FIG. 4A, the vertical pattern VP may include a vertical semiconductor pattern SP extending upward from the substrate 100. The vertical pattern VP may further include a blocking insulating layer BIL, a charge storage layer CL, and a tunnel insulating layer TL which are disposed between the cell electrode 135 and the vertical semiconductor pattern SP. The blocking insulating layer BIL may be adjacent to the cell electrode 135, and the tunnel insulating layer TL may be adjacent to the vertical semiconductor pattern SP. The charge storage layer CL may be disposed between the blocking insulating layer BIL and the tunnel insulating layer TL. For example, the tunnel insulating layer TL may include at least one of a silicon oxide layer and a silicon oxynitride layer. The charge storage layer CL may include at least one of a silicon nitride layer including trap sites and an insulating layer including conductive nano dots. The blocking insulating layer BIL may include a high-k dielectric layer of which a dielectric constant is higher than that of the tunnel insulating layer TL. In addition, the blocking insulating layer BIL may further include a barrier insulating layer (e.g., a silicon oxide layer) of which an energy band gap is greater than that of the high-k dielectric layer.

In the present embodiment, the blocking insulating layer BIL, the charge storage layer CL, and the tunnel insulating layer TL may extend in a direction substantially perpendicular to the top surface of the substrate 100 so as to be disposed between the vertical semiconductor pattern SP and the insulating layers 110. The vertical semiconductor pattern SP may have a macaroni or pipe shape, and the vertical pattern VP may further include a vertical insulating pattern VI filling an inner space of the vertical semiconductor pattern SP. For example, the vertical insulating pattern VI may include silicon oxide.

The dummy pillar DP2 may include the same material as the vertical pattern VP. According to the present embodiment, like the vertical pattern VP, the dummy pillar DP2 may include the blocking insulating layer BIL, the charge storage layer CL, the tunnel insulating layer TL, the vertical semiconductor pattern SP, and the vertical insulating pattern VI. The first dummy pillar DP1 may have the same structure as the second dummy pillar DP2.

Figure 4B:
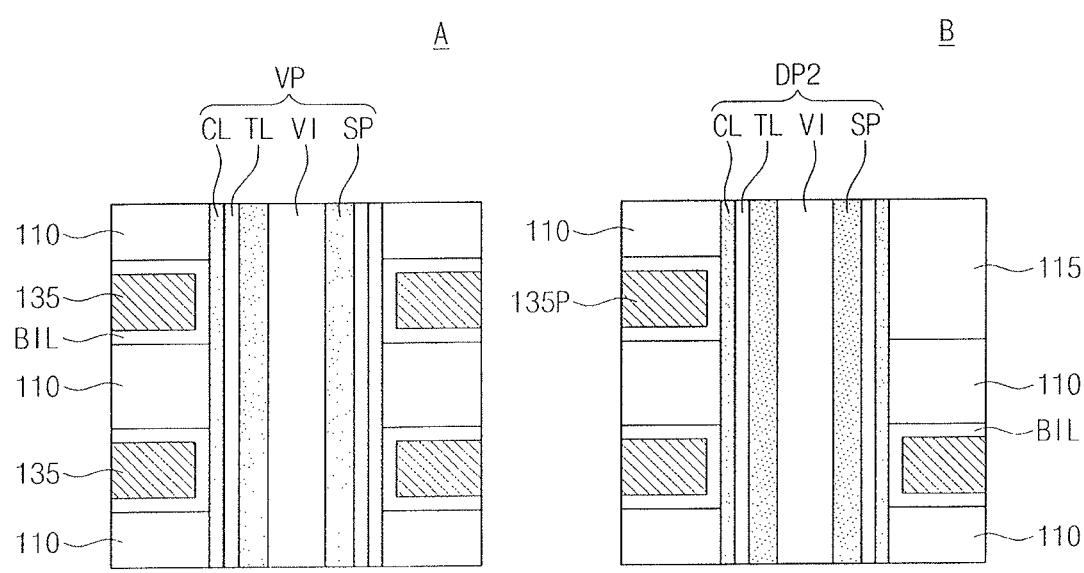
FIG. 4B illustrates enlarged views of portions 'A' and 'B' of FIG. 3 to explain a vertical pattern and a dummy pillar according to an embodiment.

FIG. 4B illustrates enlarged views of portions 'A' and 'B' of FIG. 3 to explain a vertical pattern and a dummy pillar according to an embodiment.

Referring to FIG. 4B, the vertical pattern VP may include the vertical semiconductor pattern SP extending upward from the substrate 100. The vertical pattern VP may further include the charge storage layer CL and the tunnel insulating layer TL which are disposed between the cell electrode 135 and the vertical semiconductor pattern SP. According to the present embodiment, the blocking insulating layer BIL may be disposed between the cell electrode 135 and the vertical pattern VP and may extend in a direction parallel to the top surface of the substrate 100 so as to be disposed between the cell electrode 135 and the insulating layers 110. The charge storage layer CL may be disposed between the blocking insulating layer BIL and the tunnel insulating layer TL. The vertical semiconductor pattern SP may have the macaroni or pipe shape, and the vertical pattern VP may further include the vertical insulating pattern VI filling the inner space of the vertical semiconductor pattern SP.

The dummy pillar DP2 may include the same material as the vertical pattern VP. According to the present embodiment, like the vertical pattern VP, the dummy pillar DP2 may include the charge storage layer CL, the tunnel insulating layer TL, the vertical semiconductor pattern SP, and the vertical insulating pattern VI. The first dummy pillar DP1 may have the same structure as the second dummy pillar DP2.

Figure 4C:
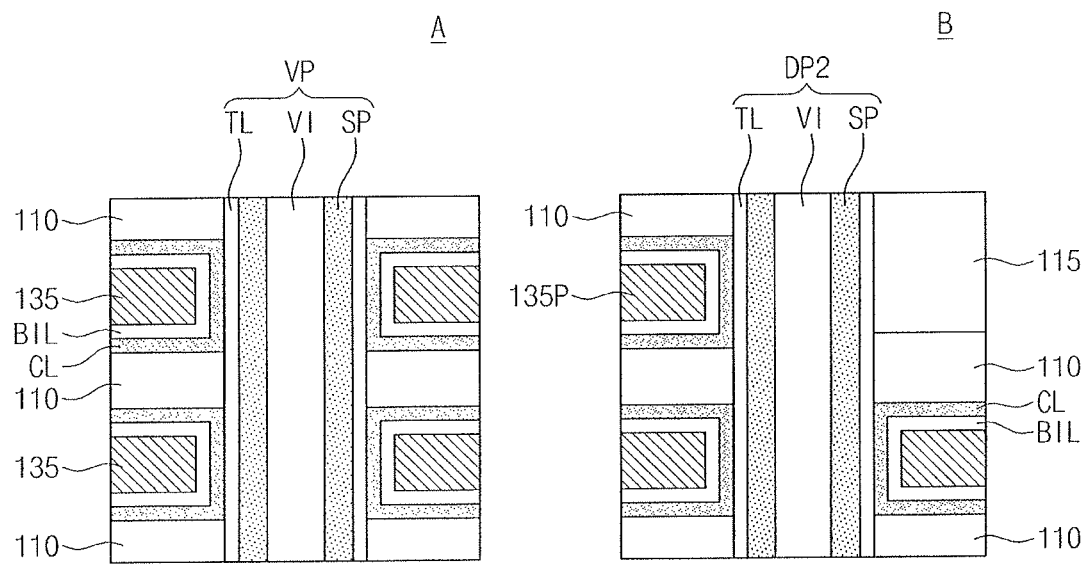
FIG. 4C illustrates enlarged views of portions 'A' and 'B' of FIG. 3 to explain a vertical pattern and a dummy pillar according to an embodiment.

FIG. 4C illustrates enlarged views of portions 'A' and 'B' of FIG. 3 to explain a vertical pattern and a dummy pillar according to an embodiment.

Referring to FIG. 4C, the vertical pattern VP may include the vertical semiconductor pattern SP extending upward from the substrate 100. The vertical pattern VP may further include the tunnel insulating layer TL disposed between the cell electrode 135 and the vertical semiconductor pattern SP. According to the present embodiment, the blocking insulating layer BIL and the charge storage layer CL may be disposed between the cell electrode 135 and the vertical pattern VP and may extend in the direction parallel to the top surface of the substrate 100 so as to be disposed between the cell electrode 135 and the insulating layers 110. The charge storage layer CL may be disposed between the blocking insulating layer BIL and the tunnel insulating layer TL. The vertical semiconductor pattern SP may have the macaroni or pipe shape, and the vertical pattern VP may further include the vertical insulating pattern VI filling the inner space of the vertical semiconductor pattern SP.

The dummy pillar DP2 may include the same material as the vertical pattern VP. According to the present embodiment, like the vertical pattern VP, the dummy pillar DP2 may include the tunnel insulating layer TL, the vertical semiconductor pattern SP, and the vertical insulating pattern VI. The first dummy pillar DP1 may have the same structure as the second dummy pillar DP2.

Figure 4D:
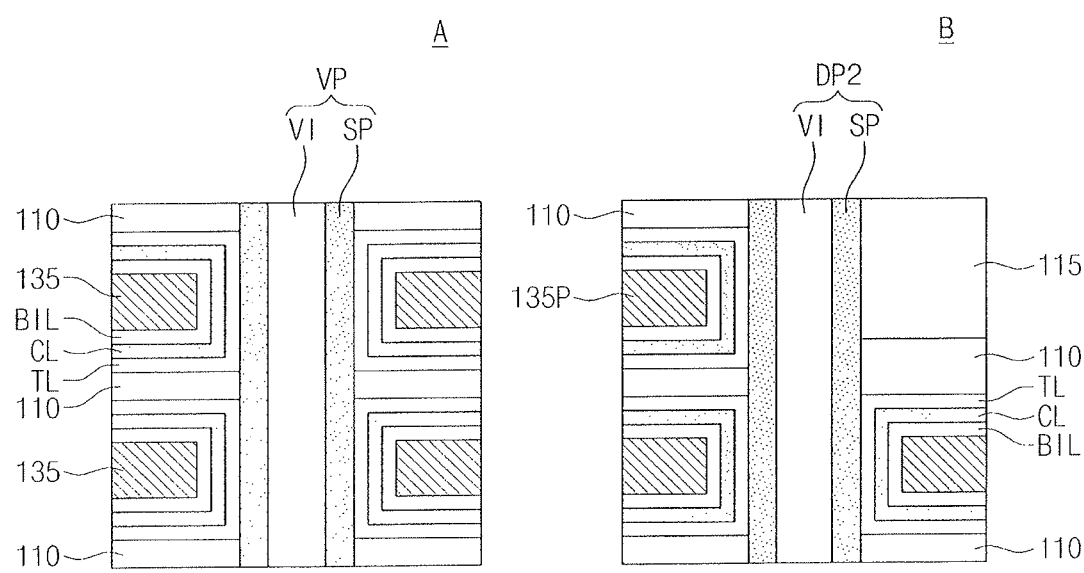
FIG. 4D illustrates enlarged views of portions 'A' and 'B' of FIG. 3 to explain a vertical pattern and a dummy pillar according to an embodiment.

FIG. 4D illustrates enlarged views of portions 'A' and 'B' of FIG. 3 to explain a vertical pattern and a dummy pillar according to an embodiment.

Referring to FIG. 4D, the vertical pattern VP may include the vertical semiconductor pattern SP extending upward from the substrate 100. According to the present embodiment, the blocking insulating layer BIL, the charge storage layer CL, and the tunnel insulating layer TL may be disposed between the cell electrode 135 and the vertical pattern VP and may extend in the direction parallel to the top surface of the substrate 100 so as to be disposed between the cell electrode 135 and the insulating layers 110. The charge storage layer CL may be disposed between the blocking insulating layer BIL and the tunnel insulating layer TL. The vertical semiconductor pattern SP may have the macaroni or pipe shape, and the vertical pattern VP may further include the vertical insulating pattern VI filling the inner space of the vertical semiconductor pattern SP.

The dummy pillar DP2 may include the same material as the vertical pattern VP. According to the present embodiment, like the vertical pattern VP, the dummy pillar DP2 may include the vertical semiconductor pattern SP and the vertical insulating pattern VI. The first dummy pillar DP1 may have the same structure as the second dummy pillar DP2.

Figure 5:
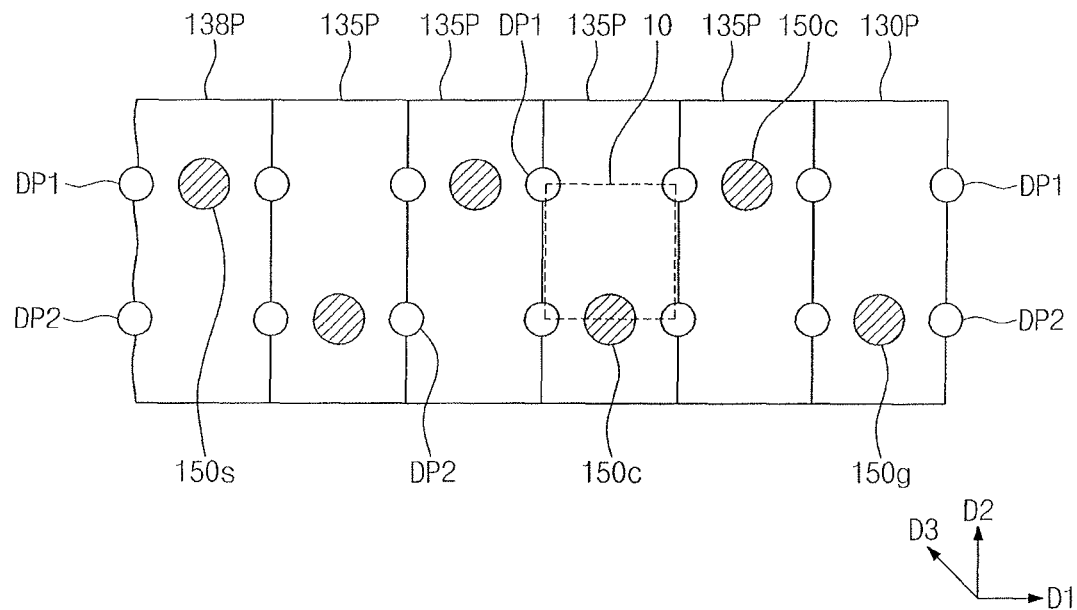
FIG. 5 illustrates a plan view of one electrode structure of FIG. 1 to explain dummy pillars according to an embodiment.

FIG. 5 is a plan view illustrating one electrode structure of FIG. 1 to explain dummy pillars according to an embodiment. Hereinafter, differences between the present embodiment and the embodiment of FIGS. 1, 2 and 3 will be mainly described for the purpose of ease and convenience in explanation.

Referring to FIG. 5, according to the present embodiment, the string selection contact plug 150s, the cell contact plugs 150c, and the ground selection contact plug 150g may be arranged in a zigzag form along the first direction D1.

In detail, the dummy pillars DP1 and DP2 penetrating each of the cell pads 135P may be disposed at the vertexes of the first imaginary polygon 10, respectively, when viewed from a plan view. The central points of the dummy pillars DP1 and DP2 penetrating each of the cell pads 135P may overlap with the vertexes of the first imaginary polygon 10, respectively. The first imaginary polygon 10 may be a quadrangle. The cell contact plug 150c connected to each of the cell pads 135P may be disposed on one side of the first imaginary polygon 10 when viewed from a plan view. For example, as illustrated in FIG. 5, a cell contact plug 150c connected to each of odd-numbered ones of the cell pads 135P may be disposed between a pair of second dummy pillars DP2 penetrating each of the odd-numbered cell pads 135P (bottom of the cell pads 135P in FIG. 5) and may be aligned with a pair of second dummy pillars DP2 in an adjacent odd-numbered cell pads 135P in the first direction D1. Similarly, a cell contact plug 150c connected to each of even-numbered ones of the cell pads 135P may be disposed between a pair of first dummy pillars DP1 penetrating each of the even-numbered cell pads 135P (top of the cell pads 135P in FIG. 5) and may be aligned with a pair of first dummy pillars DP1 in an adjacent even-numbered cell pads 135P in the first direction D1.

The dummy pillars DP1 and DP2 penetrating the string selection pad 138P may be respectively disposed at the vertexes of the first imaginary polygon 10 when viewed from a plan view, and the string selection contact plug 150s may be disposed on one side of the first imaginary polygon 10 when viewed from a plan view. The string selection contact plug 150s may be disposed between, e.g., and aligned with, the pair of first dummy pillars DP1 penetrating the string selection pad 138P or between the pair of second dummy pillars DP2 penetrating the string selection pad 138P. The string selection contact plug 150s may be aligned with the pair of first dummy pillars DP1 or the pair of second dummy pillars DP2 in the first direction D1. Likewise, the dummy pillars DP1 and DP2 penetrating the ground selection pad 130P may be respectively disposed at the vertexes of the first imaginary polygon 10 when viewed from a plan view, and the ground selection contact plug 150g may be disposed on one side of the first imaginary polygon 10 when viewed from a plan view. The ground selection contact plug 150g may be disposed between the pair of first dummy pillars DP1 penetrating the ground selection pad 130P or between the pair of second dummy pillars DP2 penetrating the ground selection pad 130P. The ground selection contact plug 150g may be aligned with the pair of first dummy pillars DP1 or the pair of second dummy pillars DP2 in the first direction D1.

Figure 6:
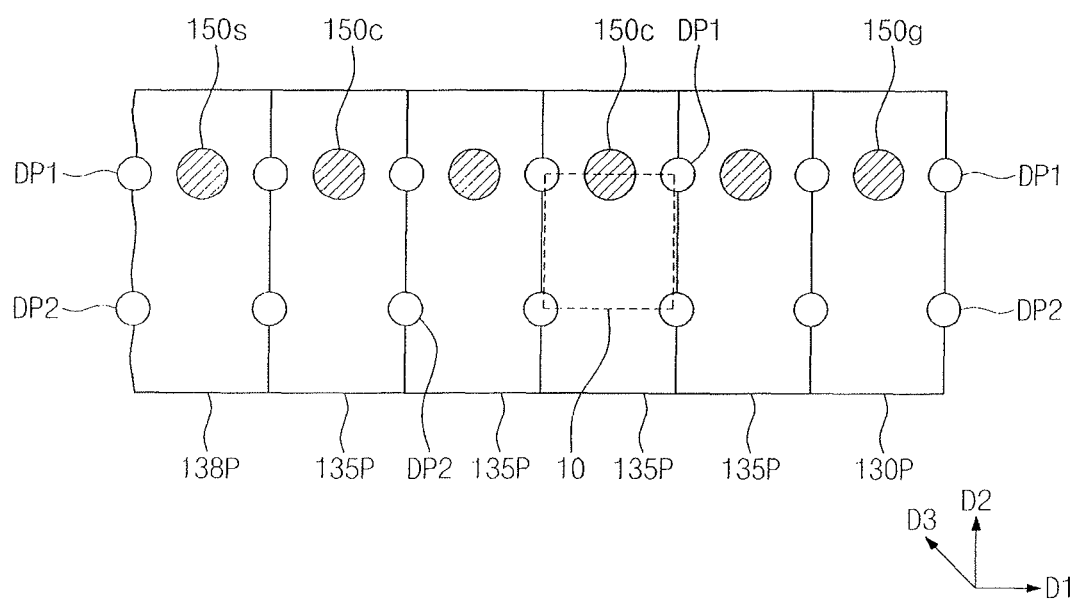
FIG. 6 illustrates a plan view of one electrode structure of FIG. 1 to explain dummy pillars according to an embodiment.

FIG. 6 is a plan view illustrating one electrode structure of FIG. 1 to explain dummy pillars according to an embodiment. Hereinafter, differences between the present embodiment and the embodiment of FIGS. 1, 2 and 3 will be mainly described for the purpose of ease and convenience in explanation.

Referring to FIG. 6, the string selection contact plug 150s, the cell contact plugs 150c, and the ground selection contact plug 150g may be arranged in a line in the first direction D1. According to the present embodiment, the first dummy pillars DP1 may be disposed between the string selection contact plug 150s and the cell contact plug 150c adjacent to the string selection contact plug 150s, between the cell contact plugs 150c adjacent to each other, and between the ground selection contact plug 150g and the cell contact plug 150c adjacent to the ground selection contact plug 150g, respectively.

In detail, the dummy pillars DP1 and DP2 penetrating each of the cell pads 135P may be disposed at the vertexes of the first imaginary polygon 10, respectively, when viewed from a plan view. The central points of the dummy pillars DP1 and DP2 penetrating each of the cell pads 135P may overlap with the vertexes of the first imaginary polygon 10, respectively. The first imaginary polygon 10 may be the quadrangle. The cell contact plug 150c connected to each of the cell pads 135P may be disposed on one side of the first imaginary polygon 10 when viewed from a plan view. The cell contact plug 150c may be disposed between the pair of first dummy pillars DP1 penetrating each of the cell pads 135P and may be aligned with the pair of first dummy pillars DP1 in the first direction D1.

The dummy pillars DP1 and DP2 penetrating the string selection pad 138P may be respectively disposed at the vertexes of the first imaginary polygon 10 in a plan view, and the string selection contact plug 150s may be disposed on one side of the first imaginary polygon 10 in a plan view. The string selection contact plug 150s may be disposed between the pair of first dummy pillars DP1 penetrating the string selection pad 138P and may be aligned with the pair of first dummy pillars DP1 in the first direction D1. Likewise, dummy pillars DP1 and DP2 penetrating the ground selection pad 130P may be respectively disposed at the vertexes of the first imaginary polygon 10 in a plan view, and the ground selection contact plug 150g may be disposed on one side of the first imaginary polygon 10 in a plan view. The ground selection contact plug 150g may be disposed between the pair of first dummy pillars DP1 penetrating the ground selection pad 130P and may be aligned with the pair of first dummy pillars DP1 in the first direction D1.

According to the present embodiment, the dummy pillars DP1 and DP2 may penetrate the pads 130P, 135P, and 138P constituting the stepped structure in the second region R2 so as to be in contact with the substrate 100. The dummy pillars DP1 and DP2 penetrating each of the cell pads 135P may penetrate the boundaries between each of the cell pads 135P and the pads adjacent to both sides of each of the cell pads 135P. In other words, each of the cell pads 135P and the pads adjacent to both sides thereof may share the dummy pillars DP1 and DP2 penetrating each of the cell pads 135P. Since the electrode structure ES is supported using a minimum number of the dummy pillars DP1 and DP2, shape variation of the electrode structure ES may be minimized. In addition, the minimum of the dummy pillars DP1 and DP2 may support a mold stack structure used during a replacement process of forming the electrode structure ES, and thus, shape variation of the pads 130P, 135P, and 138P may be minimized using the minimum of the dummy pillars DP1 and DP2. As a result, it is possible to realize the 3D semiconductor device with excellent reliability.

FIGS. 7 to 13 are cross-sectional views taken along lines I-I', II-II', III-III', and IV-IV' of FIG. 1 to illustrate stages in a method of manufacturing a 3D semiconductor device according to an embodiment.

Figure 7:
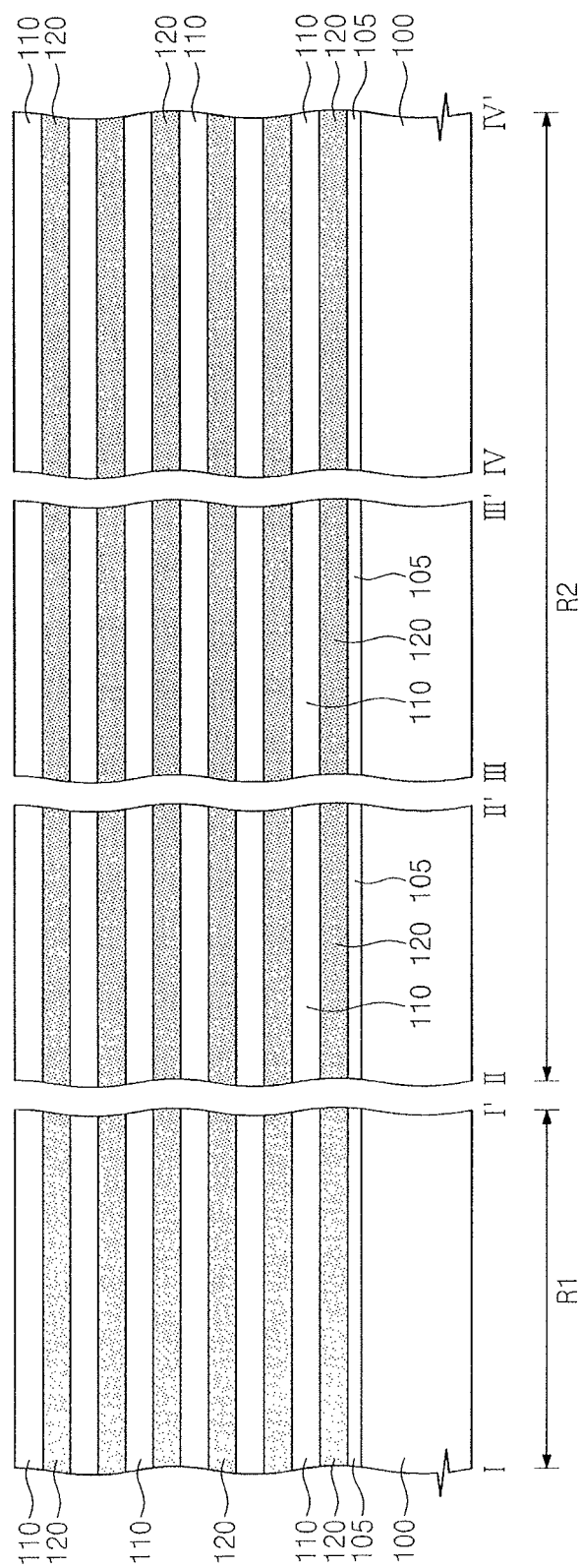
FIGS. 7 to 13 illustrate cross-sectional views taken along lines I-I', II-II', III-III', and IV-IV' of FIG. 1 to illustrate stages in a method of manufacturing a 3D semiconductor device according to an embodiment.

Referring to FIG. 7, the buffer insulating layer 105 may be formed on an entire top surface of the substrate 100 including the first region R1 and the second region R2. Sacrificial layers 120 and insulating layers 110 may be alternately formed on the substrate 100 having the buffer insulating layer 105. The sacrificial layers 120 may be formed of a material having an etch selectivity with respect to the buffer insulating layer 105 and the insulating layers 110. For example, the buffer insulating layer 105 and the insulating layers 110 may be formed of silicon oxide layers, and the sacrificial layers 120 may be formed of silicon nitride layers.

Figure 8:
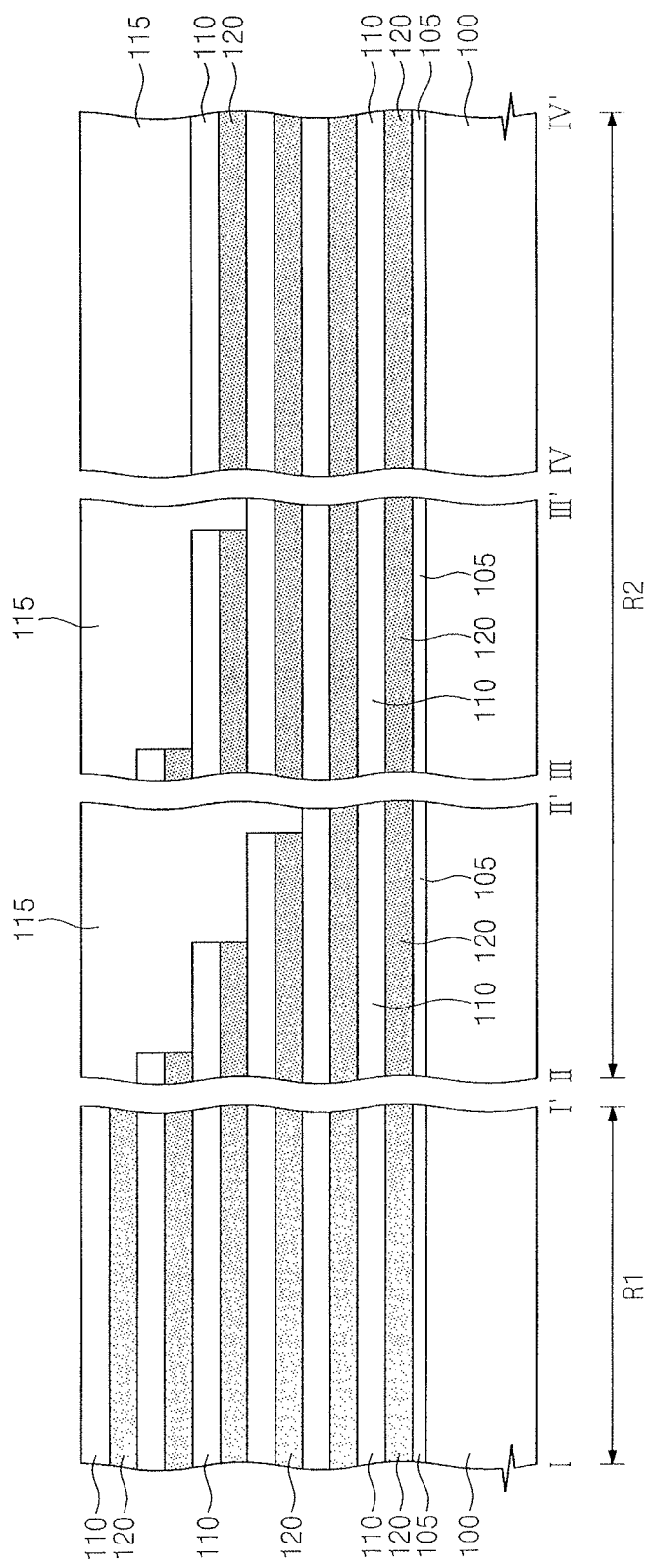

Referring to FIG. 8, the insulating layers 110 and the sacrificial layers 120 in the second region R2 may be patterned to form a stepped structure. In an embodiment, a mask pattern (not shown) may be formed on the uppermost insulating layer 110, and the uppermost insulating layer 110 and the uppermost sacrificial layer 120 may be etched using the mask pattern as an etch mask to expose the next-uppermost insulating layer 110 in the second region 60. Subsequently, the mask pattern may be etched to reduce a width of the mask pattern. The next-uppermost insulating layer 110 and the next-uppermost sacrificial layer 120 may be etched using the etched mask pattern as an etch mask. The etching process of the insulating layers 110 and the sacrificial layer 120 and the etching process of the mask pattern may be repeatedly performed to form the stepped structure in the second region R2.

Thereafter, the capping insulating layer 115 may be formed on the substrate 100 and may be then planarized. According to an embodiment, the capping insulating layer 115 may be planarized until the uppermost insulating layer 110 of the first region R1 is exposed. According to an embodiment, the planarized capping insulating layer 115 may remain on the uppermost insulating layer 110 of the first region R1.

Figure 9:
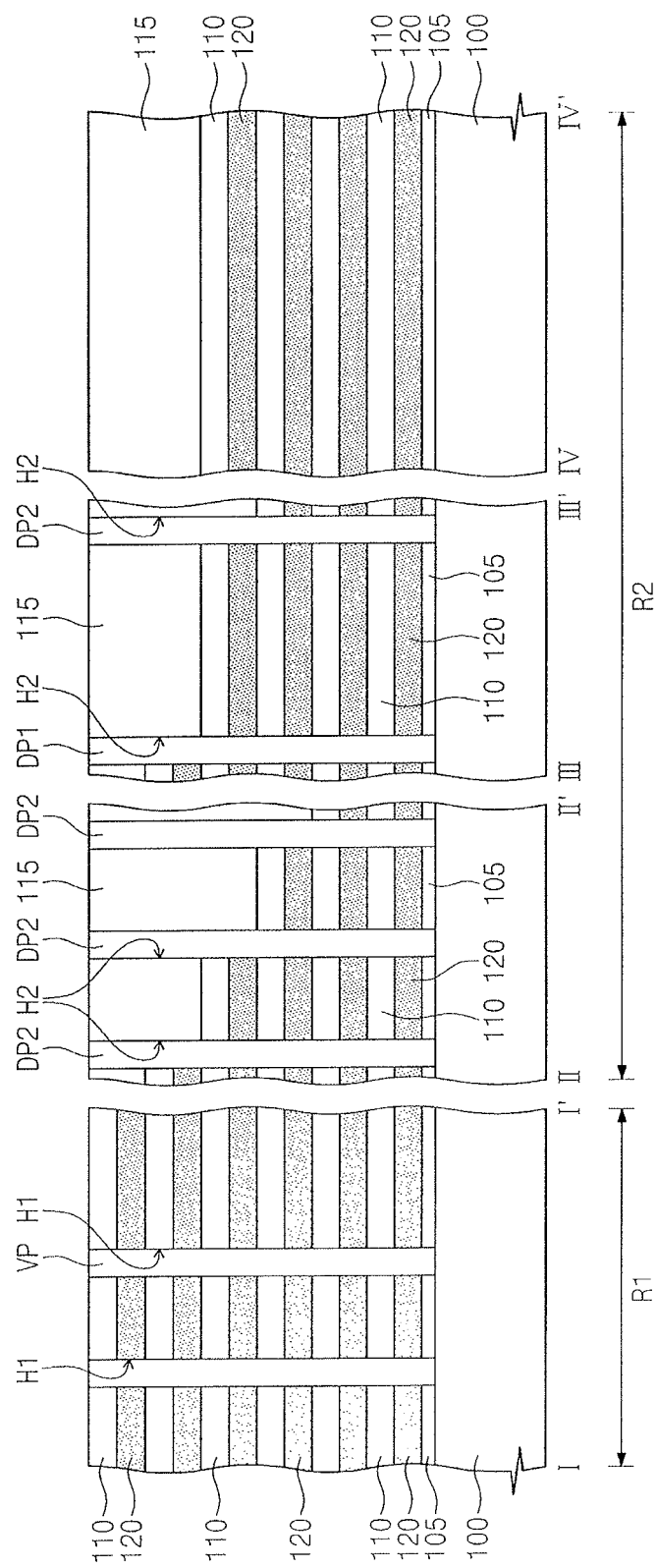

Referring to FIG. 9, the insulating layers 110, the sacrificial layers 120, and the buffer insulating layer 105 of the first region R1 may be successively patterned to form vertical holes H1 exposing the substrate 100. In addition, the capping insulating layer 115, the insulating layers 110, the sacrificial layers 120, and the buffer insulating layer 105 of the second region R2 may be successively patterned to from dummy holes H2 exposing the substrate 100. The vertical holes H1 and the dummy holes H2 may be formed at the same time.

The vertical holes H1 may be arranged as the vertical patterns VP described with reference to FIG. 2. Likewise, the dummy holes H2 may be arranged as the dummy pillars DP1 and DP2 described with reference to FIG. 2. In other words, the dummy holes H2 may be disposed at the vertexes of the first imaginary polygon 10 of FIG. 2, respectively, and the vertical holes H1 may be disposed at the vertexes of the second imaginary polygon 20 of FIG. 2, respectively.

The vertical patterns VP may be formed in the vertical holes H1, respectively, and the dummy pillars DP1 and DP2 may be formed in the dummy holes H2, respectively. The vertical patterns VP and the dummy pillars DP1 and DP2 may be formed at the same time. The vertical patterns VP and the dummy pillars DP1 and DP2 may be formed as described in one of the embodiments of the FIG. 4A to 4D.

Figure 10:
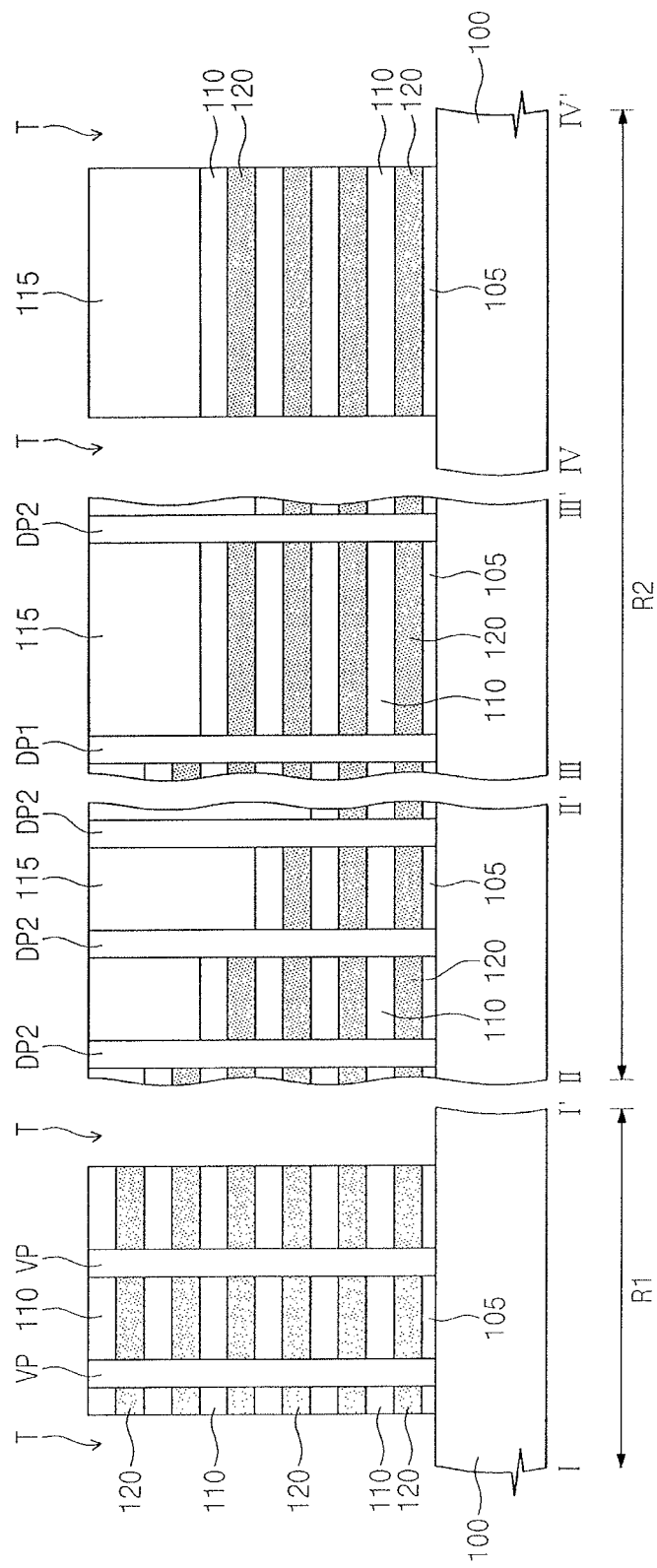

Referring to FIG. 10, the capping insulating layer 115, the insulating layers 110, the sacrificial layers 120, and the buffer insulating layer 105 may be successively patterned to form trenches T exposing the substrate 100. The trenches T may extend from the first region R1 into the second region R2, so a mold stack structure extending from the first region R1 into the second region R2 may be defined between the trenches T. The mold stack structure may include the insulating layers 110, the sacrificial layers 120, the buffer insulating layer 105, and the capping insulating layer 115. The insulating layers 110, the sacrificial layers 120, the buffer insulating layer 105, and the capping insulating layer 115 may have sidewalls exposed by the trenches T. The sacrificial layers 120 may have sacrificial pads that constitute a stepped structure in the second region R2. The insulating layers 110 may cover the sacrificial pads of the sacrificial layers 110, respectively. The capping insulating layer 115 may cover the sacrificial pads constituting the stepped structure in the second region R2. The vertical patterns VP and the dummy pillars DP1 and DP2 may penetrate the mold stack structure so as to be in contact with the substrate 100.

A replacement process may be performed to the mold stack structure to form the electrode structure ES of FIG. 3. Hereinafter, the replacement process will be described in detail with reference to FIGS. 11 and 12.

Figure 11:
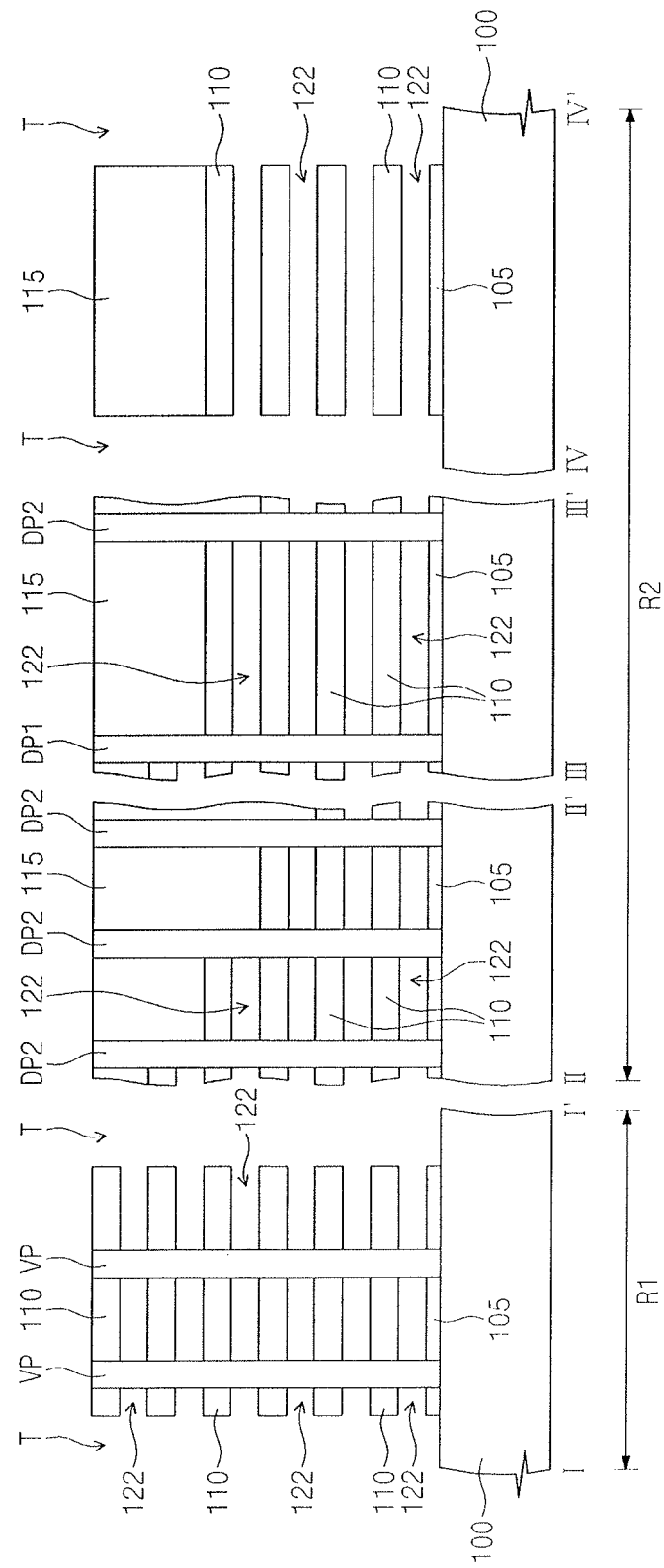

Referring to FIG. 11, the sacrificial layers 120 exposed by the trenches T may be removed to form empty regions 122 between the insulating layers 110. The empty regions 122 may extend from the trenches T into between the insulating layers 110 in a direction parallel to the top surface of the substrate 100. The sacrificial layers 120 may be removed by an isotropic etching process (e.g., a wet etching process).

When the sacrificial layers 120 are removed, the dummy pillars DP1 and DP2 support the insulating layers 110 and the capping layer 115 in the second region R2, and the vertical patterns VP may support the insulating layers 110 in the first region R1. Thus, it is possible to minimize or prevent problems which may be caused by the removal of the sacrificial layers 120.

For example, if the dummy pillars DP1 and DP2 did not exist, the insulating layers 110 vertically adjacent to each other in the second region R2 could be close to or come in contact with each other. Thus, shapes of pads to be formed in the empty regions 122 in a subsequent process could vary, e.g., at least a portion of the pads could not be formed. However, according to embodiments, formation of the dummy pillars DP1 and DP2 through the insulating layers 110 in the second region R2 supports the insulating layers 110 during removal of the sacrificial layers 120, thereby minimizing or preventing the above problems, e.g., misalignment and/or breaking of the insulating layers 110.

Figure 12:
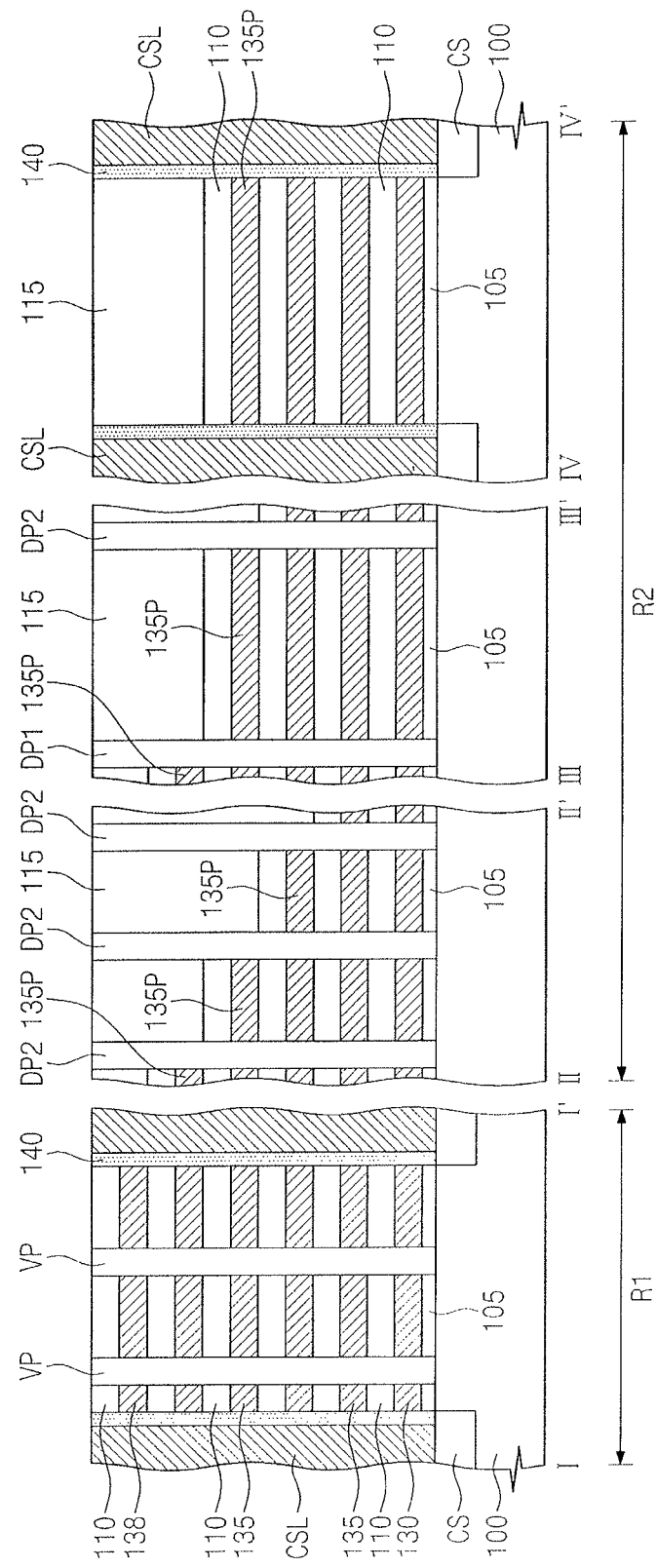

Referring to FIGS. 1 and 12, a first conductive layer may be formed on the substrate 100 to fill the trenches T and the empty regions 122. The first conductive layer may include a barrier layer conformally covering inner surfaces of the trenches T and the empty regions 122, and an electrode layer filling the rest regions of the trenches T and the empty regions 122. Thereafter, the first conductive layer disposed in the trenches T may be removed to form the electrodes 130, 135, and 138, and the pads 130P, 135P, and 138P in the empty regions 122. Thus, the electrode structure ES described with reference to FIGS. 1 to 3 may be formed.

When the vertical patterns VP and the dummy pillars DP1 and DP2 are formed as illustrated in FIG. 4B, the blocking insulating layer BIL may be conformally formed in the empty regions 122 before the formation of the first conductive layer. When the vertical patterns VP and the dummy pillars DP1 and DP2 are formed as illustrated in FIG. 4C, the charge storage layer CL and the blocking insulating layer BIL may be sequentially formed in the empty regions 122 before the formation of the first conductive layer. When the vertical patterns VP and the dummy pillars DP1 and DP2 are formed as illustrated in FIG. 4D, the tunnel insulating layer TL, the charge storage layer CL, and the blocking insulating layer BIL may be sequentially formed in the empty regions 122 before the formation of the first conductive layer.

Dopant ions may be implanted into the substrate 100 disposed under the trenches T to form the common source regions CS. The common source regions CS may be formed after the formation of the electrodes 130, 135, and 138. Alternatively, the common source regions may be formed after the formation of the trenches T and before the removal of the sacrificial layers 120.

The Common source lines CSL and insulating spacers 140 may be formed in the trenches T. The common source lines CSL may be electrically connected to the common source regions CS, and the insulating spacers 140 may electrically insulate the common source lines CSL from the electrodes 130, 135, and 138. Forming the insulating spacers 140 may include forming an insulating spacer layer (not shown) conformally covering top surfaces of the common source regions CS and inner sidewalls of the trenches T, and anisotropically etching the insulating spacer layer. The common source regions CS may be exposed by the anisotropic etching process of the insulating spacer layer. Subsequently, a second conductive layer may be formed to fill the rest regions of the trenches T. The second conductive layer may be planarized to confinedly form the common source lines CSL in the trenches T, respectively.

Figure 13:
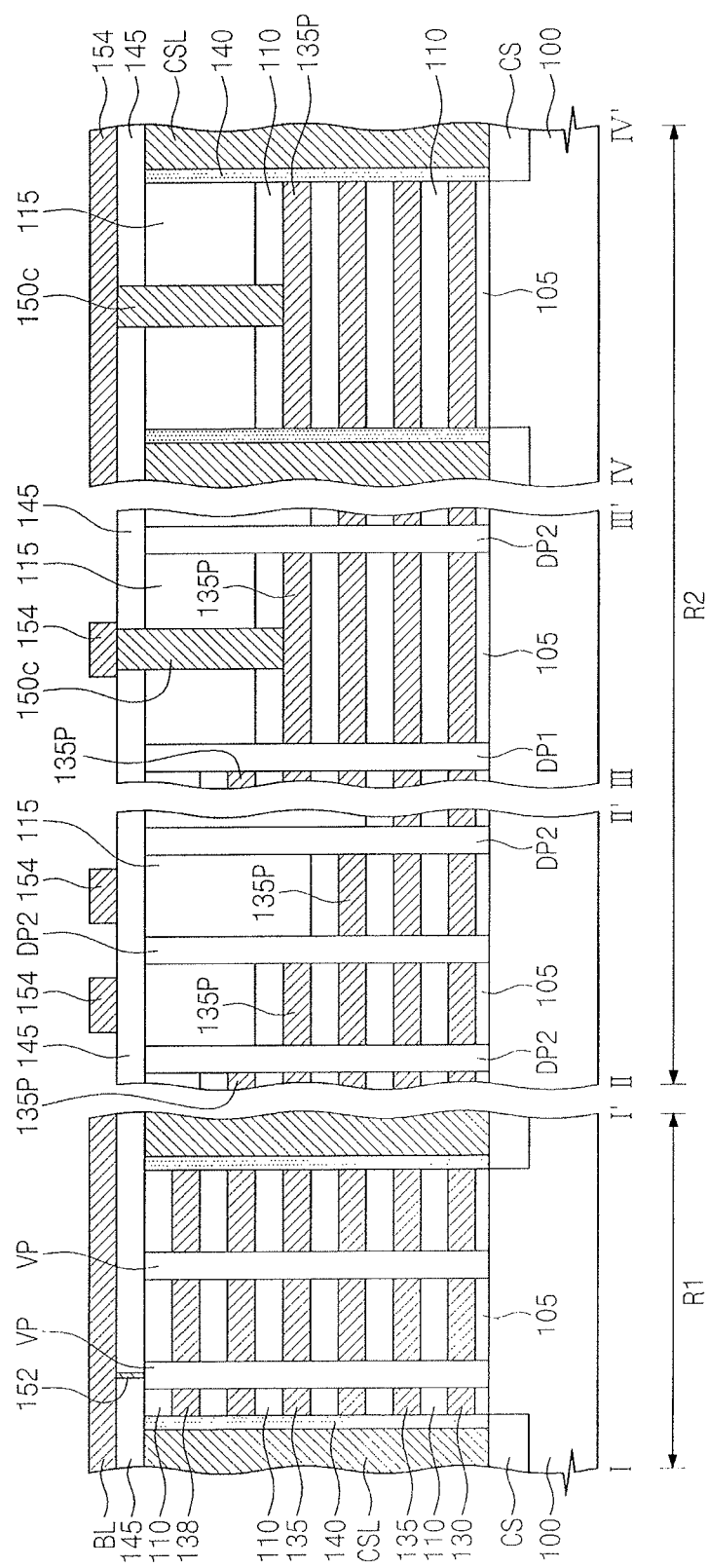

Referring to FIGS. 1 and 13, the first insulating layer 145 may be formed on an entire top surface of the substrate 100. The first insulating layer 145 may include the electrode structure and may extend in the direction parallel to the top surface of the substrate 100 to cover top surfaces of the insulating spacers 140 and top surfaces of the common source lines CSL.

Contact plugs 150s, 150c, and 150g may be formed in the second region R2 so as to be connected to the pads 130P, 135P, and 138P, respectively. The contact plugs 150a, 150c, and 150g may penetrate the first insulating layer 145, the capping insulating layer 115, and the insulating layers 110. Bit line contact plugs 152 may be formed to penetrate the first insulating layer 145 in the first region R1. The bit line contact plugs 152 may be connected to the vertical patterns VP, respectively. The contact plugs 150a, 150c, and 150g and the bit line contact plugs 152 may be formed of a conductive material and may be formed at the same time.

Bit lines BL may be formed on the first insulating layer 145 in the first region R1, and the first interconnections 154 may be formed on the first insulating layer 145 in the second region R2. The bit lines BL may be connected to the bit line contact plugs 152, and the first interconnections 154 may be connected to the ground selection contact plug 150g and the cell contact plugs 150c, respectively. The bit lines BL and the first interconnections 154 may be formed of a conductive material and may be formed at the same time.

Referring again to FIGS. 1 and 3, the second insulating layer 160 may be formed on the first insulating layer 145, the bit lines BL, and the first interconnections 154. The second interconnections 170 may be formed on the second insulating layer 160. The second interconnections 170 may be electrically connected to the string selection contact plugs 150s, respectively. The string selection contact plug 150s may be electrically connected to a corresponding one of the second interconnections 170 through an interconnection plug 165 penetrating the second insulating layer 160.

Figure 14:
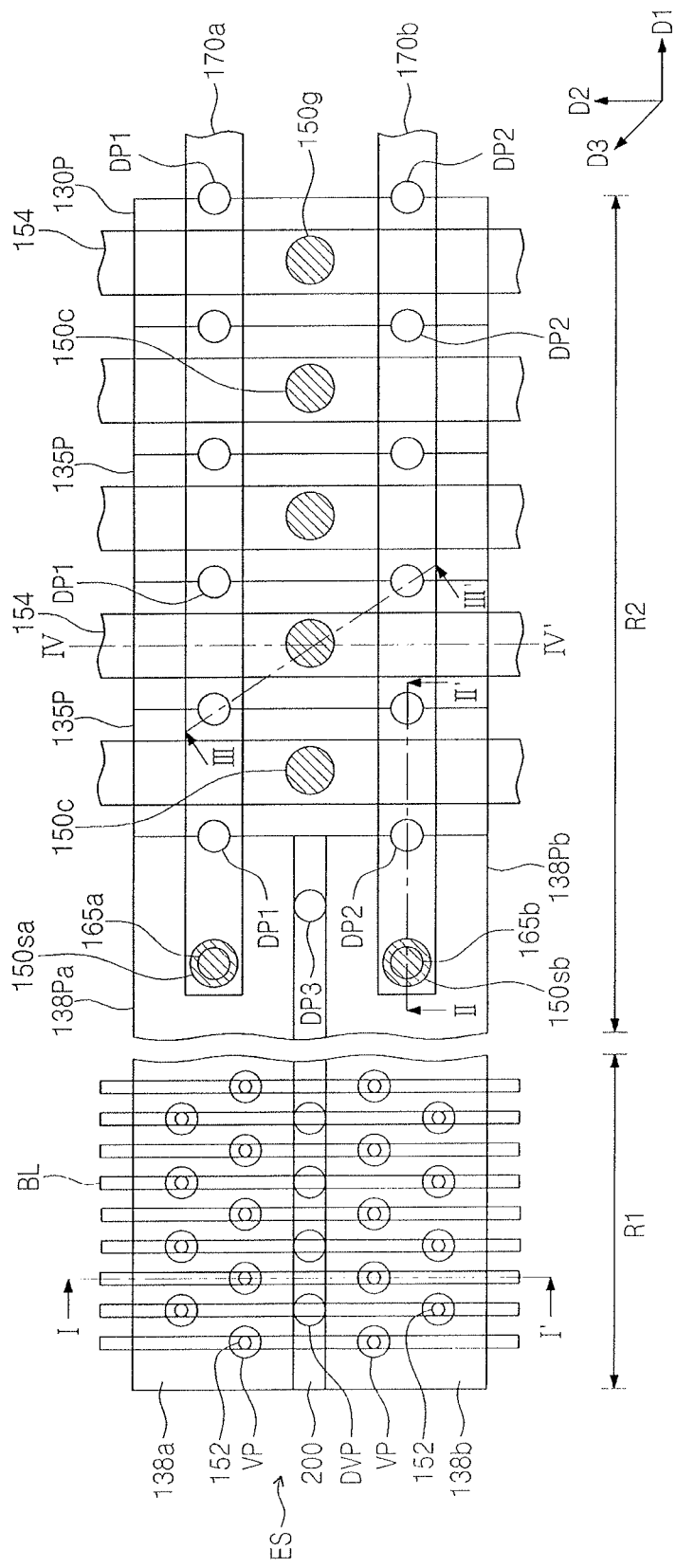
FIG. 14 illustrates a plan view illustrating a 3D semiconductor device according to an embodiment.
Figure 15:
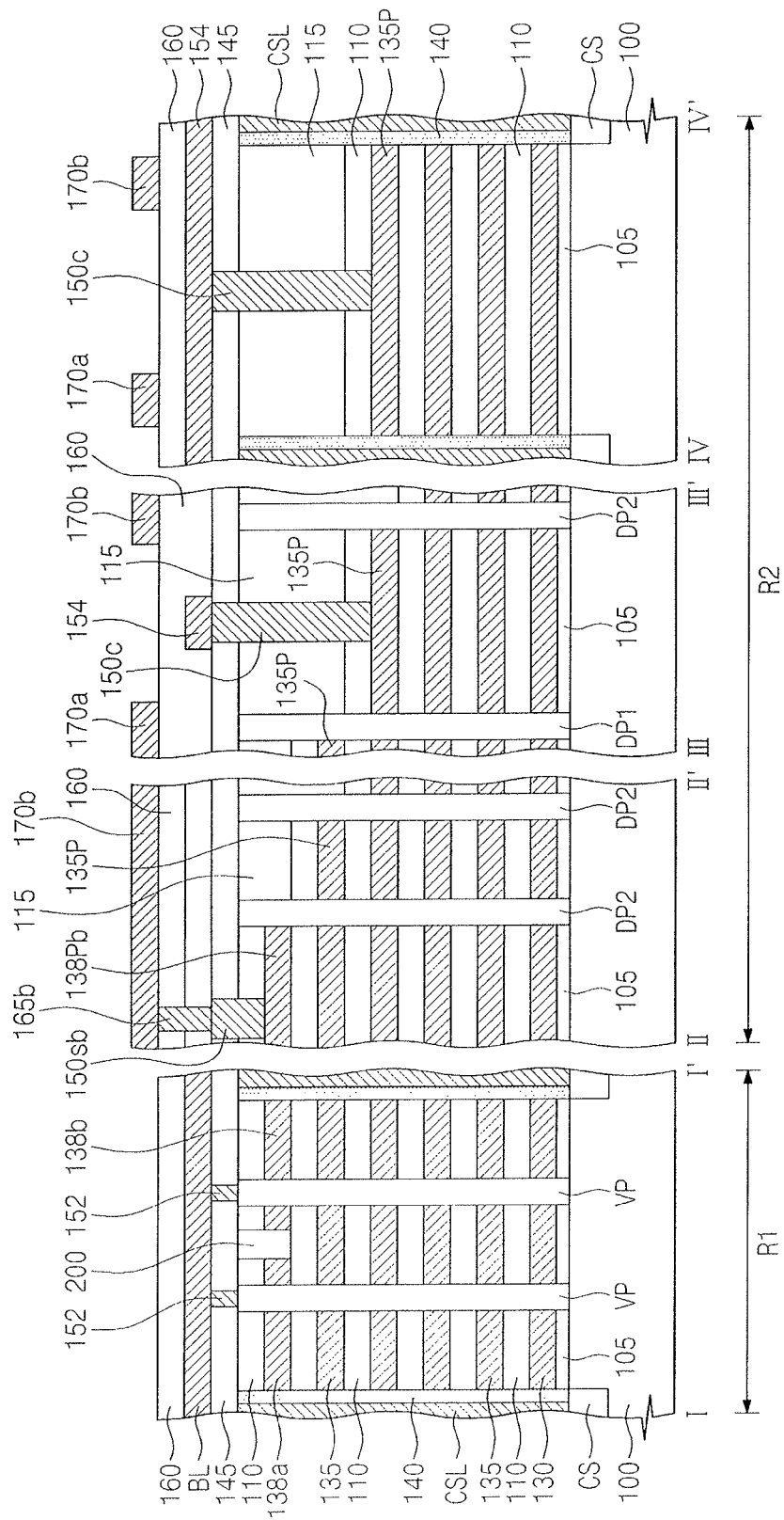
FIG. 15 illustrates a cross-sectional view taken along lines I-I', II-II', III-III', and IV-IV' of FIG. 14.

FIG. 14 is a plan view illustrating a 3D semiconductor device according to an embodiment. FIG. 15 is a cross-sectional view taken along lines I-I', II-II', III-III', and IV-IV' of FIG. 14. Hereinafter, the same elements as described in the embodiment of FIGS. 1 to 3 will be indicated by the same reference numerals or the same reference designators, and differences between the present embodiment and the embodiment of FIGS. 1 to 3 will be mainly described for the purpose of ease and convenience in explanation.

Referring to FIGS. 14 and 15, in the present embodiment, the electrode structure ES may include a plurality of string selection electrodes 138a and 138b. A cutting insulation pattern 200 may be disposed between the string selection electrodes 138a and 138b. In other words, a first string selection electrode 138a and a second string selection electrode 138b may be separated from each other by the cutting insulation pattern 200. A bottom surface of the cutting insulation pattern 200 may be higher than a top surface of the uppermost cell electrode 135. In other words, the plurality of string selection electrodes 138a and 138b may be disposed on one uppermost cell electrode 135. The cutting insulation pattern 200 may include, for example, silicon oxide.

The cutting insulation pattern 200 may extend from the first region R1 into the second region R2, so a first string selection pad 138Pa of the first string selection electrode 138a may be separated from a second string selection pad 138Pb of the second string selection electrode 138b by the cutting insulation pattern 200.

Vertical patterns VP and DVP may penetrate the electrode structure ES of the first region R1. The vertical patterns VP and DVP may constitute a plurality of rows parallel to the first direction D1. The vertical patterns VP and DVP constituting adjacent two of the plurality of rows may be arranged in a zigzag form along the first direction D1. The vertical patterns VP and DVP may include dummy vertical patterns DVP overlapping with the cutting insulation pattern 200, and cell vertical patterns VP spaced apart from the cutting insulation pattern 200. The dummy vertical patterns DVP may be arranged in the first direction D1 to constitute one of the plurality of rows. The cell vertical patterns VP may constitute the others of the plurality of rows.

The vertical patterns VP constituting the outermost rows of the plurality of rows may be defined as outer vertical patterns, and the vertical patterns VP and DVP constituting inner rows of the plurality of rows may be defined as inner vertical patterns. Each of the inner vertical patterns VP and DVP may be disposed at the central point of the second imaginary polygon 20 described with reference to FIG. 2, and neighboring vertical patterns VP and DVP surrounding each of the inner vertical patterns VP and DVP may be disposed at the vertexes of the second imaginary polygon 20, respectively. The second imaginary polygon 20 may be a hexagon.

A first string selection contact plug 150sa and a second string selection contact plug 150sb may be connected to the first string selection pad 138Pa and the second string selection pad 138Pb, respectively. According to the present embodiment, the first and second string selection contact plugs 150sa and 150sb may be respectively disposed at two of the vertexes of the first imaginary polygon 10 described with reference to FIG. 2 when viewed from a plan view. Dummy pillars DP1 and DP2 penetrating the first and second string selection pads 138Pa and 138Pb may be respectively disposed at the others of the vertexes of the first imaginary polygon 10 when viewed from a plan view. The first string selection contact plug 150sa may be aligned with a first dummy pillar DP1 penetrating the first string selection pad 138Pa in the first direction D1. The second string selection contact plug 150sb may be aligned with a second dummy pillar DP2 penetrating the second string selection pad 138Pb in the first direction D1. An additional dummy pillar DP3 may be further provided at the central point of the first imaginary polygon 10. However, embodiments are not limited thereto. In an embodiment, the additional dummy pillar DP3 may be omitted.

A first upper interconnection 170a and a second upper interconnection 170b may be electrically connected to the first string selection pad 138Pa and the second string selection pad 138Pb, respectively. The first string selection pad 138Pa may be electrically connected to the first upper interconnection 170a through the first string selection contact plug 150sa and a first interconnection plug 165a penetrating the second insulating layer 160 of the second region R2. The second string selection pad 138Pb may be electrically connected to the second upper interconnection 170b through the second string selection contact plug 150sb and a second interconnection plug 165b penetrating the second insulating layer 160 of the second region R2.

In the first region R1, each of the bit lines BL may be electrically connected to the cell vertical patterns VP arranged in the second direction D2. In this case, the cell vertical patterns VP arranged in the second direction D2 may penetrate the plurality of string selection electrodes 138a and 138b, respectively.

FIGS. 16 to 19 are cross-sectional views taken along lines I-I', II-II', III-III', and IV-IV' of FIG. 14 to illustrate a method of manufacturing a 3D semiconductor device according to an embodiment. Hereinafter, the same elements as described in the embodiment of FIGS. 7 to 13 will be indicated by the same reference numerals or the same reference designators, and differences between the present embodiment and the embodiment of FIGS. 7 to 13 will be mainly described for the purpose of ease and convenience in explanation.

Figure 16:
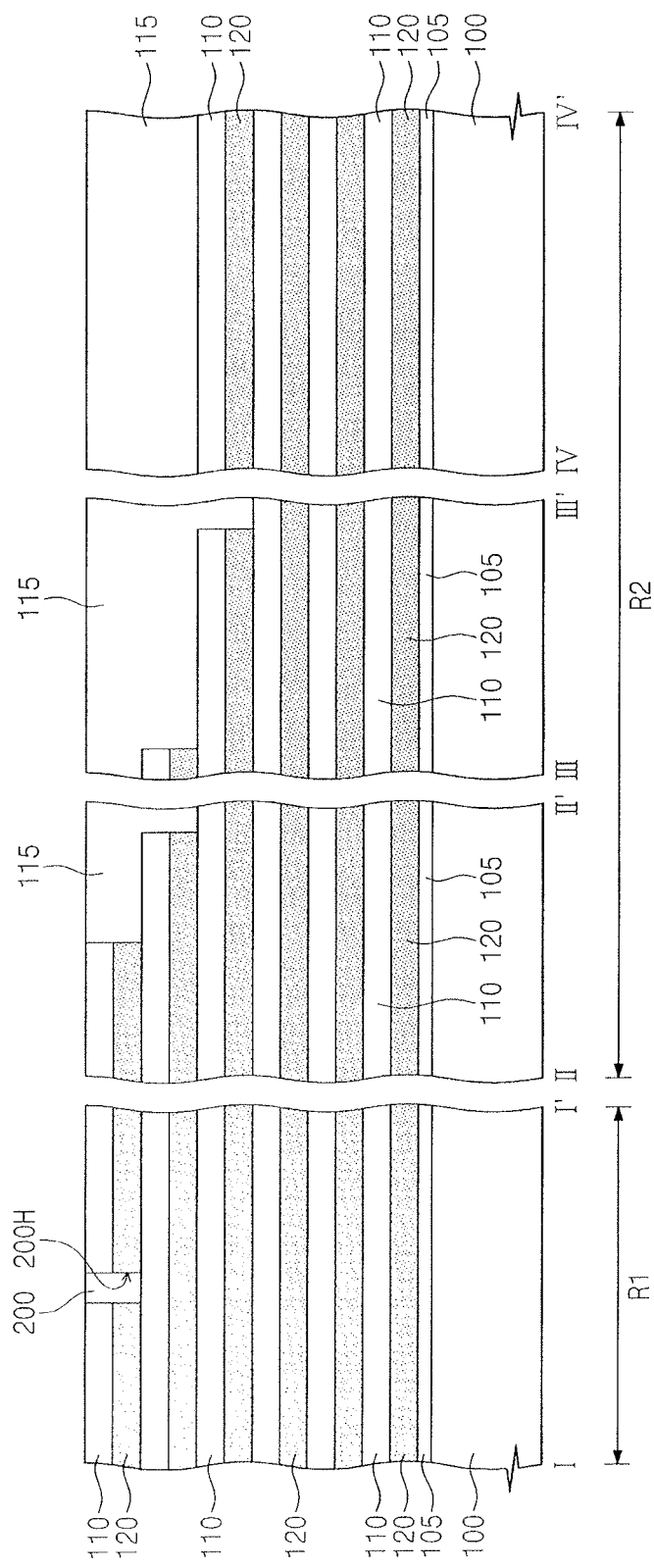
FIGS. 16 to 19 illustrate cross-sectional views taken along lines I-I', II-II', III-III', and IV-IV' of FIG. 14 to illustrate a method of manufacturing a 3D semiconductor device according to an embodiment.

Referring to FIGS. 14 and 16, the buffer insulating layer 105 may be formed on an entire top surface of the substrate 100 including the first region R1 and the second region R2. The sacrificial layers 120 and insulating layers 110 may be alternately formed on the substrate 100 having the buffer insulating layer 105. The insulating layers 110 and the sacrificial layers 120 in the second region R2 may be patterned to form a stepped structure. The capping insulating layer 115 may be formed to cover the stepped structure.

The uppermost insulating layer 110 and the uppermost sacrificial layer 120 may be patterned to form a cutting region 200H. The cutting region 200H may extend from the first region R1 into the second region R2. The cutting insulation pattern 200 may be formed to fill the cutting region 200H. In an embodiment, the cutting region 200H and the cutting insulation pattern 200 may be formed after the formation of the stepped structure of the sacrificial layers 120 and the capping insulating layer 115. Alternatively, the stepped structure of the sacrificial layers 120 and the capping insulating layer 115 may be formed after the formation of the cutting region 200H and the cutting insulation pattern 200.

Figure 17:
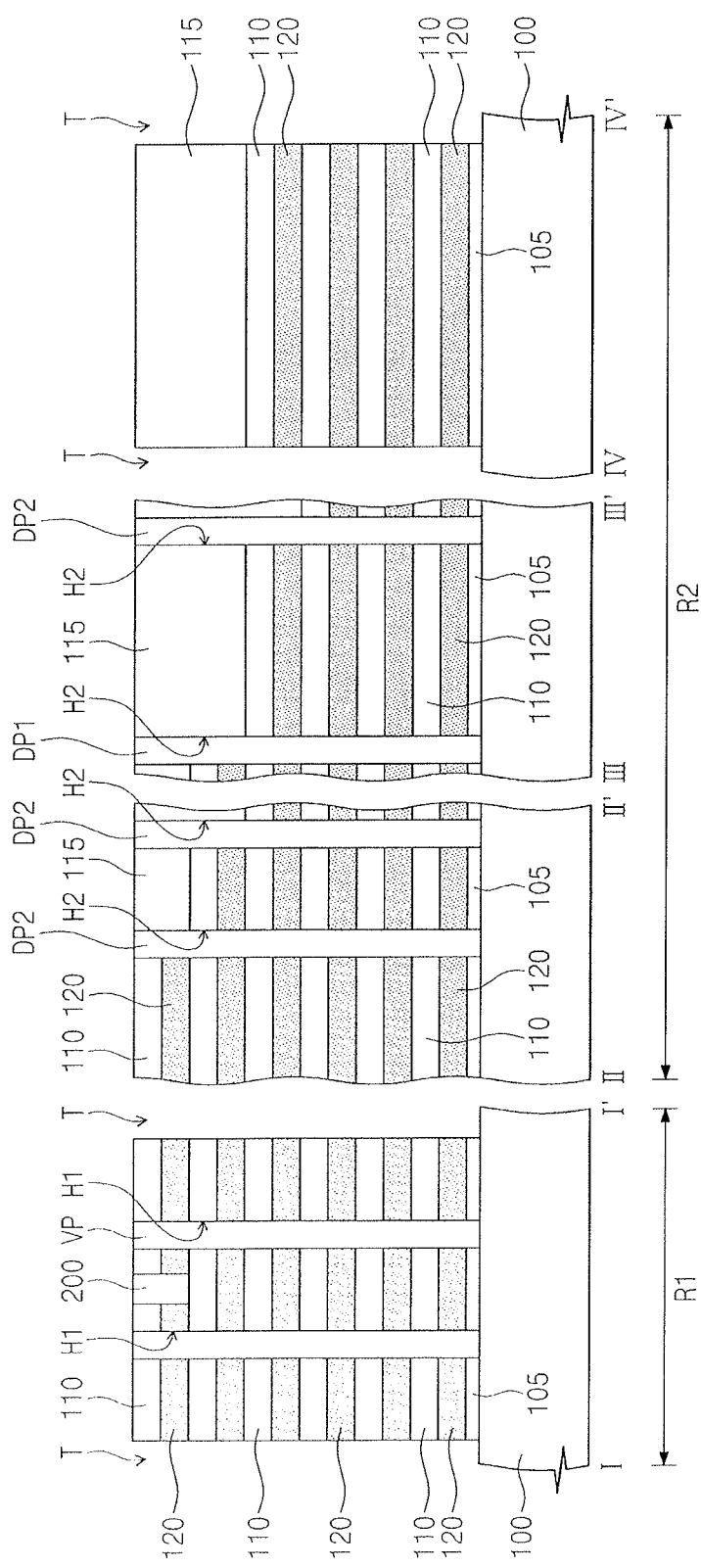

Referring to FIGS. 14 and 17, the insulating layers 110, the sacrificial layers 120 and the buffer insulating layer 105 of the first region R1 may be successively patterned to form the vertical holes H1 exposing the substrate 100. In addition, the capping insulating layer 115, the insulating layers 110, the sacrificial layers 120, and the buffer insulating layer 105 of the second region R2 may be successively patterned to from the dummy holes H2 exposing the substrate 100. The vertical holes H1 and the dummy holes H2 may be formed at the same time. The vertical holes H1 may be arranged as the vertical patterns VP and DVP of FIG. 14, and the dummy holes H2 may be arranged as the dummy pillars DP1, DP2 and DP3 of FIG. 14.

Vertical patterns VP and DVP may be formed in the vertical holes H1, respectively, and dummy pillars DP1, DP2 and DP3 may be formed in the dummy holes H2, respectively. The vertical patterns VP and DVP and the dummy pillars DP1, DP2 and DP3 may be formed at the same time. The vertical patterns VP and DVP and the dummy pillars DP1, DP2 and DP3 may be formed as described in one of the embodiments of the FIG. 4A to 4D.

The capping insulating layer 115, the insulating layers 110, the sacrificial layers 120, and the buffer insulating layer 105 may be successively patterned to form trenches T exposing the substrate 100. The trenches T may extend from the first region R1 into the second region R2, so a mold stack structure extending from the first region R1 into the second region R2 may be defined between the trenches T. The mold stack structure may include the insulating layers 110, the sacrificial layers 120, the buffer insulating layer 105, and the capping insulating layer 115. At this time, the uppermost sacrificial layer 120 of the mold stack structure may include the uppermost sacrificial patterns laterally separated from each other by the cutting insulation pattern 200. The insulating layers 110, the sacrificial layers 120, the buffer insulating layer 105, and the capping insulating layer 115 may have sidewalls exposed by the trenches T.

Figure 18:
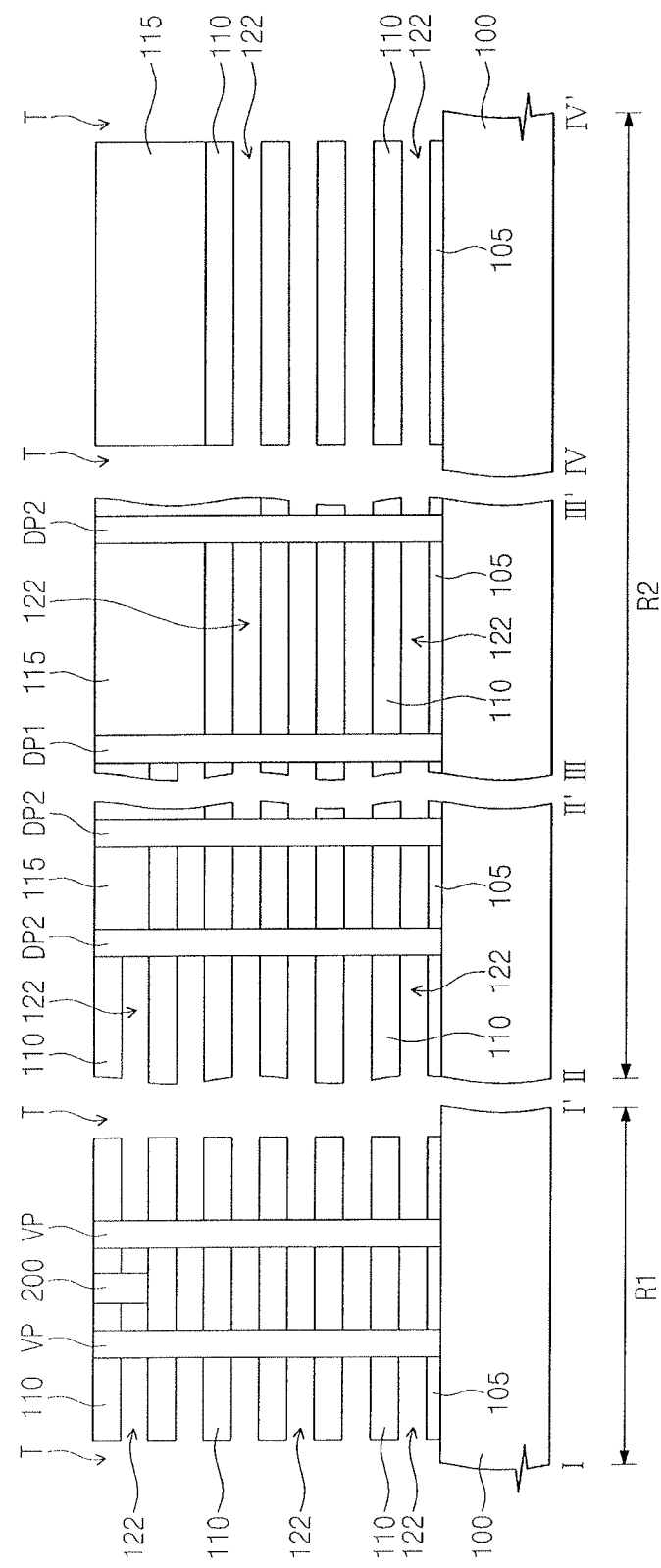

Referring to FIG. 18, the sacrificial layers 120 exposed by the trenches T may be removed to form empty regions 122 between the insulating layers 110. When the sacrificial layers 120 are removed, the vertical patterns VP and DVP and the dummy pillars DP1, DP2 and DP3 may support the insulating layers 110. Since the sacrificial layers 120 are removed, the uppermost empty regions 122 respectively corresponding to the uppermost sacrificial patterns may be formed in the mold stack structure.

Figure 19:
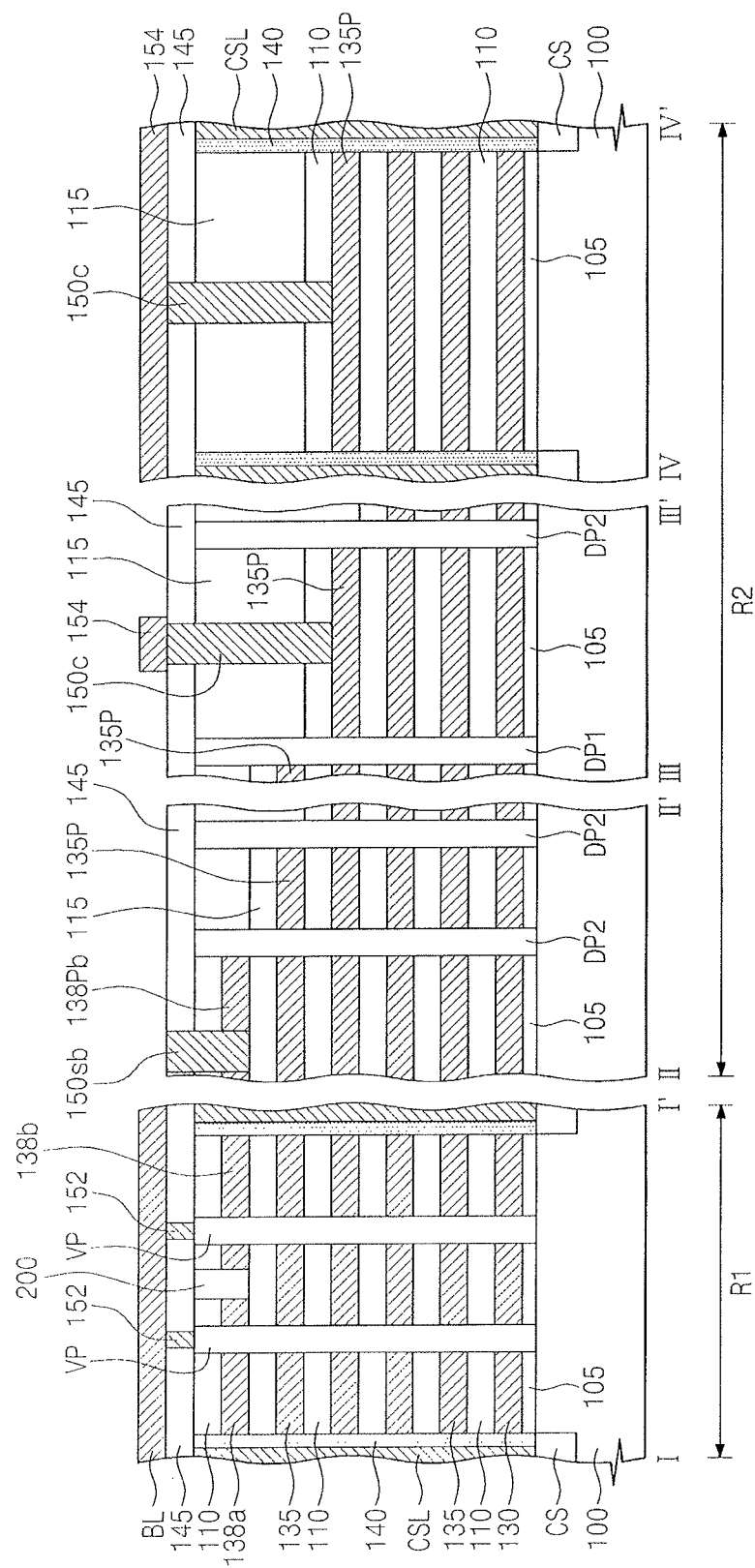

Referring to FIGS. 14 and 19, a first conductive layer may be formed on the substrate 100 to fill the trenches T and the empty regions 122. Thereafter, the first conductive layer disposed in the trenches T may be removed to form electrodes 130, 135, 138a and 138b and pads 130P, 135P, 138Pa and 138Pb in the empty regions 122. Thus, the electrode structure ES described with reference to FIGS. 14 and 15 may be formed.

A first string selection electrode 138a and a second string selection electrode 138b may be formed in the uppermost empty regions 122, respectively. The first and second string selection electrodes 138a and 138b may be laterally spaced apart from each other by the cutting insulation pattern 200. In addition, a first string selection pad 138Pa of the first string selection electrode 138a may also be laterally spaced apart from a second string selection pad 138Pb of the second string selection electrode 138b by the cutting insulation pattern 200.

Dopant ions may be implanted into the substrate 100 disposed under the trenches T to form common source regions CS. Common source lines CSL and insulating spacers 140 may be formed in the trenches T. The common source lines CSL may be electrically connected to the common source regions CS, and the insulating spacers 140 may electrically insulate the common source lines CSL from the electrodes 130, 135, 138a and 138b.

The first insulating layer 145 may be formed on an entire top surface of the substrate 100. The first insulating layer 145 may include the electrode structure and may extend in the direction parallel to the top surface of the substrate 100 to cover top surfaces of the insulating spacers 140 and top surfaces of the common source lines CSL.

The bit line contact plugs 152 may be formed to penetrate the first insulating layer 145 of the first region R1. The bit line contact plugs 152 may be connected to the cell vertical patterns VP of the vertical patterns VP and DVP, respectively. In other words, the bit line contact plugs 152 may not be formed on the dummy vertical patterns DVP.

Contact plugs 150sa, 150sb, 150c and 150g may be formed to penetrate the first insulating layer 145, the capping insulating layer 115, and the insulating layers in the second region R2. The contact plugs 150sa, 150sb, 150c and 150g may be connected to the pads 138Pa, 138Pb, 135P and 130P, respectively.

The bit lines BL may be formed on the first insulating layer 145 in the first region R1, and first interconnections 154 may be formed on the first insulating layer 145 in the second region R2. The bit lines BL may be connected to the bit line contact plugs 152, and the first interconnections 154 may be connected to the ground selection contact plug 150g and the cell contact plugs 150c, respectively.

Referring to FIGS. 14 and 15, a second insulating layer 160 may be formed on the first insulating layer 145, the bit lines BL, and the first interconnections 154. A first upper interconnection 170a and a second upper interconnection 170b may be formed on the second insulating layer 160. The first upper interconnection 170a may be electrically connected to the first string selection pad 138Pa through a first interconnection plug 165a and the first string selection contact plug 150sa. The second upper interconnection 170b may be electrically connected to the second string selection pad 138Pb through a second interconnection plug 165b and the second string selection contact plug 150sb. The first and second interconnection plugs 165a and 165b may penetrate the second insulating layer 160 of the second region R2.

According to embodiments, a 3D semiconductor device with excellent reliability is provided. That is, dummy pillars may penetrate pads constituting a stepped structure in a second region of a substrate, so as to be in contact with the substrate. The dummy pillars penetrating each of the cell pads may penetrate boundaries between adjacent cell pads, so each of the cell pads and the pads adjacent to both sides thereof may share the dummy pillars penetrating each of the cell pads. Since adjacent cell pads in the electrode structure share dummy pillars, a number of dummy pillars supporting the electrode structure is minimized. Further, the minimal number of dummy pillars supporting the electrode structure minimizes shape variation of the electrode structure. In addition, since a minimal number of dummy pillars supporting the mold stack structure is used during the replacement process of forming the electrode structure, shape variation of the cell pads may be minimized, thereby minimizing or preventing deterioration of the electrode structure.

Furthermore, the dummy pillars penetrating each of the cell pads may be disposed to surround the cell contact plug connected to each of the cell pads when viewed from a plan view. Thus, a distance between the cell contact plug and the common source line adjacent thereto may be increased to easily insulate the cell contact plug from the common source line.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A three-dimensional (3D) semiconductor device, comprising:
    an electrode structure on a substrate that includes a first region and a second region, the electrode structure including:
    a plurality of electrodes which are stacked in a direction perpendicular to a top surface of the substrate, and
    pads which are electrically connected to the plurality of the electrodes, the pads defining a stepped structure in the second region of the substrate;
    dummy pillars penetrating the pads and a portion of the electrode structure under the pads; and
    contact plugs electrically connected to the pads, respectively,
    wherein the dummy pillars include at least two dummy pillars penetrating one of the pads, and one of the contact plugs is between the at least two dummy pillars and is connected to one of the pads,
    wherein the one of the pads is adjacent to an upper one or a lower one of the pads in a first direction, and
    wherein the one of the contact plugs is closer to an edge of the one of the pads than an opposite edge of the one of the pads along a second direction crossing the first direction.

2. The 3D semiconductor device as claimed in claim 1, wherein a size of the dummy pillars is smaller than that of the contact plugs, when viewed from a plan view.

3. The 3D semiconductor device as claimed in claim 1, wherein one of the at least two dummy pillars is closer to the edge of the one of the pads than the opposite edge of the one of the pads along the second direction.

4. The 3D semiconductor device as claimed in claim 3, wherein the one of the contact plugs is aligned with the one of the at least two dummy pillars in the first direction.

5. The 3D semiconductor device as claimed in claim 1, further comprising a plurality of vertical patterns penetrating the electrode structure in the first region, corresponding ones of the plurality of vertical patterns being respectively at vertexes of an imaginary hexagon, when viewed from a plan view.

6. The 3D semiconductor device as claimed in claim 5, wherein the dummy pillars include a same material as the vertical patterns.

7. The 3D semiconductor device as claimed in claim 1, further comprising:
    an additional electrode structure on the substrate, the additional electrode structure including a plurality of additional electrodes stacked in the direction perpendicular to the top surface of the substrate, the additional electrode structure including additional pads electrically connected to the plurality of the additional electrodes, and the additional pads defining a stepped structure in the second region of the substrate; and
    additional contact plugs electrically connected to the additional pads, respectively, one of the additional contact plugs being at a center of one of the additional pads.

8. The 3D semiconductor device as claimed in claim 1, further comprising a plurality of vertical patterns penetrating the electrode structure in the first region,
    wherein the plurality of vertical patterns includes a first vertical pattern and second vertical patterns surrounding the first vertical pattern, and wherein the second vertical patterns are respectively at vertexes of an imaginary hexagon, and the first vertical pattern is at a central point of the imaginary hexagon, in a plan view.

9. A three-dimensional (3D) semiconductor device, comprising:

an electrode structure on a substrate that includes a first region and a second region, the electrode structure including a plurality of electrodes which are stacked in a direction perpendicular to a top surface of the substrate, and the plurality of electrodes respectively include pads which define a stepped structure in the second region of the substrate;

dummy pillars penetrating the pads and a portion of the electrode structure under the pads; and contact plugs electrically connected to the pads, respectively, wherein the dummy pillars include four dummy pillars penetrating one of the pads, and the four dummy pillars surround one of the contact plugs when viewed from a plan view, wherein a size of the dummy pillars is smaller than that of the contact plugs, when viewed from the plan view.

10. The 3D semiconductor device as claimed in claim 9, wherein the four dummy pillars are at vertexes of an imaginary quadrangle, respectively, when viewed from the plan view.

11. The 3D semiconductor device as claimed in claim 10, wherein the one of the contact plugs is at a central point of the imaginary quadrangle, when viewed from the plan view.

12. The 3D semiconductor device as claimed in claim 9, wherein the four dummy pillars include a pair of first dummy pillars arranged in a first direction, and a pair of second dummy pillars arranged in the first direction and spaced apart from the pair of first dummy pillars in a second direction intersecting the first direction, wherein one of the first dummy pillars is aligned with the one of the cell contact plug in a third direction intersecting the first and second directions.

13. The 3D semiconductor device as claimed in claim 9, further comprising a plurality of vertical patterns penetrating the electrode structure in the first region, wherein corresponding ones of the plurality of vertical patterns are respectively at vertexes of an imaginary hexagon, when viewed from the plan view.

14. The 3D semiconductor device as claimed in claim 13, wherein the dummy pillars include a same material as the vertical patterns.

15. The 3D semiconductor device as claimed in claim 13, further comprising bit lines on the electrode structure in the first region, wherein the plurality of vertical patterns includes at least one dummy vertical pattern and at least one cell vertical pattern, and only the at least one cell vertical pattern is connected to a corresponding one of the bit lines.

16. A three-dimensional (3D) semiconductor device, comprising:

an electrode structure on a substrate that includes a first region and a second region, the electrode structure including a plurality of electrodes stacked in a direction perpendicular to a top surface of the substrate, and the plurality of the electrodes includes pads, respectively, which define a stepped structure in the second region of the substrate;

a plurality of vertical patterns penetrating the electrode structure in the first region;

dummy pillars penetrating the pads and a portion of the electrode structure under the pads; and contact plugs electrically connected to the pads, respectively, wherein corresponding ones of the plurality of vertical patterns are respectively at vertexes of an imaginary hexagon when viewed from a plan view, and wherein one of the dummy pillars penetrates a first boundary between a first pair of adjacent pads and another of the dummy pillars penetrates a second boundary between a second pair of adjacent pads.

17. The 3D semiconductor device as claimed in claim 16, wherein the first pair of adjacent pads includes one of the pads and an adjacent upper one of the pads, and the second pair of adjacent pads includes the one of the pads and an adjacent lower one of the pads.

18. The 3D semiconductor device as claimed in claim 16, wherein corresponding ones of the dummy pillars are at vertexes of an imaginary quadrangle, respectively, when viewed from the plan view.

19. The 3D semiconductor device as claimed in claim 18, wherein one of the contact plugs is at a central point of the imaginary quadrangle, when viewed from the plan view.

20. The 3D semiconductor device as claimed in claim 16, wherein the dummy pillars include a same material as the plurality of vertical patterns.

\* \* \* \* \*